(12) United States Patent
Clifton et al.

(10) Patent No.: US 10,170,627 B2
(45) Date of Patent: Jan. 1, 2019

(54) NANOWIRE TRANSISTOR WITH SOURCE AND DRAIN INDUCED BY ELECTRICAL CONTACTS WITH NEGATIVE SCHOTTKY BARRIER HEIGHT

(71) Applicant: Acorn Technologies, Inc., La Jolla, CA (US)

(72) Inventors: Paul A. Clifton, Palo Alto, CA (US); Andreas Goebel, Mountain View, CA (US); Walter A. Harrison, Palo Alto, CA (US)

(73) Assignee: Acorn Technologies, Inc., La Jolla, CA (US)

( * ) Notice: Subject to any disclaimer, the term of this patent is extended or adjusted under 35 U.S.C. 154(b) by 0 days.

(21) Appl. No.: 15/816,231

(22) Filed: Nov. 17, 2017

(65) Prior Publication Data

US 2018/0145184 A1      May 24, 2018

Related U.S. Application Data

(60) Provisional application No. 62/424,176, filed on Nov. 18, 2016, provisional application No. 62/456,437, filed on Feb. 8, 2017.

(51) Int. Cl.
*H01L 29/00* (2006.01)
*H01L 29/786* (2006.01)
(Continued)

(52) U.S. Cl.
CPC ........ *H01L 29/78618* (2013.01); *B82Y 10/00* (2013.01); *H01L 29/0673* (2013.01);
(Continued)

(58) Field of Classification Search
CPC ............ H01L 29/0673; H01L 29/0847; H01L 29/41725; H01L 29/41791
(Continued)

(56) References Cited

U.S. PATENT DOCUMENTS 3,513,366 A   5/1970 Clark
3,590,471 A   7/1971 Lepselter et al.
(Continued)

FOREIGN PATENT DOCUMENTS

EP   0295490 A1   12/1988
EP   0789388 A2   8/1997
(Continued)

OTHER PUBLICATIONS

"Research Achievements", Research Achievements at RCIQE, downloaded Apr. 12, 2002, from: http://www.rciqe.hokudai.ac.jp/RCIQEold/ResearchAchievements.html, 8 pgs.
(Continued)

*Primary Examiner* — Tan N Tran
(74) *Attorney, Agent, or Firm* — Ascenda Law Group, PC

(57) ABSTRACT

A nanowire transistor includes undoped source and drain regions electrically coupled with a channel region. A source stack that is electrically isolated from a gate conductor includes an interfacial layer and a source conductor, and is coaxially wrapped completely around the source region, extending along at least a portion of the source region. A Schottky barrier between the source conductor and the source region is a negative Schottky barrier and a concentration of free charge carriers is induced in the semiconductor source region.

26 Claims, 11 Drawing Sheets

(51) Int. Cl.

| | | |
|---|---|---|
| *H01L 29/06* | (2006.01) | |
| *H01L 29/423* | (2006.01) | |
| *H01L 29/78* | (2006.01) | |
| *B82Y 10/00* | (2011.01) | |
| *H01L 29/417* | (2006.01) | |
| *H01L 29/775* | (2006.01) | |
| *H01L 29/08* | (2006.01) | |

(52) U.S. Cl.
CPC .... *H01L 29/0847* (2013.01); *H01L 29/41725* (2013.01); *H01L 29/41791* (2013.01); *H01L 29/42392* (2013.01); *H01L 29/775* (2013.01); *H01L 29/785* (2013.01); *H01L 29/7839* (2013.01); *H01L 29/7851* (2013.01); *H01L 29/78696* (2013.01)

(58) Field of Classification Search
USPC .......................................... 257/27, 73, 347
See application file for complete search history.

(56) References Cited

U.S. PATENT DOCUMENTS

| | | |
|---|---|---|
| 3,708,360 A | 1/1973 | Wakefield, Jr. et al. |
| 3,983,264 A | 9/1976 | Schroen et al. |
| 3,983,574 A | 9/1976 | Statz et al. |
| 4,019,113 A | 4/1977 | Hartman |
| 4,056,642 A | 11/1977 | Saxena et al. |
| 4,300,152 A | 11/1981 | Lepselter |
| 4,338,616 A | 7/1982 | Bol |
| 4,422,090 A | 12/1983 | Shepherd et al. |
| 4,485,550 A | 12/1984 | Koeneke et al. |
| 4,566,021 A | 1/1986 | Yokoyama |
| 4,583,110 A | 4/1986 | Jackson et al. |
| 4,723,197 A | 2/1988 | Takiar et al. |
| 4,811,077 A | 3/1989 | Fowler et al. |
| 4,843,029 A | 6/1989 | Joyce et al. |
| 4,999,685 A | 3/1991 | Waldrop et al. |
| 5,021,365 A | 6/1991 | Kirchner et al. |
| 5,027,166 A | 6/1991 | Ohtsuka et al. |
| 5,098,859 A | 3/1992 | Jackson et al. |
| 5,243,213 A | 9/1993 | Miyazawa et al. |
| 5,308,998 A | 5/1994 | Yamazaki et al. |
| 5,399,206 A | 3/1995 | De Lyon |
| 5,438,210 A | 8/1995 | Worley |
| 5,578,848 A | 11/1996 | Kwong et al. |
| 5,596,218 A | 1/1997 | Soleimani et al. |
| 5,608,266 A | 3/1997 | Agnello et al. |
| 5,612,567 A | 3/1997 | Baliga |
| 5,663,584 A | 9/1997 | Welch |
| 5,801,398 A | 9/1998 | Hebiguchi |
| 5,801,444 A | 9/1998 | Aboelfotoh et al. |
| 5,888,891 A | 3/1999 | Gould |
| 5,908,313 A | 6/1999 | Chau et al. |
| 5,939,763 A | 8/1999 | Hao et al. |
| 5,943,575 A | 8/1999 | Chung et al. |
| 6,011,271 A | 1/2000 | Sakuma et al. |
| 6,037,605 A | 3/2000 | Yoshimura |
| 6,064,082 A | 5/2000 | Kawai et al. |
| 6,071,783 A | 6/2000 | Liang et al. |
| 6,091,076 A | 7/2000 | Deleonibus et al. |
| 6,096,590 A | 8/2000 | Chan et al. |
| 6,117,781 A | 9/2000 | Lukanc et al. |
| 6,150,286 A | 11/2000 | Sun et al. |
| 6,198,113 B1 | 3/2001 | Grupp |
| 6,207,976 B1 | 3/2001 | Takahashi et al. |
| 6,261,932 B1 | 7/2001 | Hulfachor |
| 6,291,282 B1 | 9/2001 | Wilk et al. |
| 6,291,866 B1 | 9/2001 | Wallace et al. |
| 6,291,867 B1 | 9/2001 | Wallace et al. |
| 6,293,137 B1 | 9/2001 | Liu et al. |
| 6,303,479 B1 | 10/2001 | Snyder |
| 6,326,294 B1 | 12/2001 | Jang et al. |
| 6,339,232 B1 | 1/2002 | Takagi |
| 6,344,673 B1 | 2/2002 | Aussilhou |
| 6,380,021 B1 | 4/2002 | Wang et al. |
| 6,452,244 B1 | 9/2002 | Miura et al. |
| 6,462,931 B1 | 10/2002 | Tang et al. |
| 6,492,735 B1 | 12/2002 | Matsubara |
| 6,548,875 B2 | 4/2003 | Nishiyama |
| 6,608,352 B1 | 8/2003 | Long et al. |
| 6,680,224 B2 | 1/2004 | Shin et al. |
| 6,724,068 B2 | 4/2004 | Matsuyama |
| 6,724,088 B1 | 4/2004 | Jammy et al. |
| 6,833,556 B2 | 12/2004 | Grupp et al. |
| 6,891,234 B1 | 5/2005 | Connelly et al. |
| 7,057,333 B1 | 6/2006 | Vu Thien et al. |
| 7,084,423 B2 | 8/2006 | Grupp et al. |
| 7,112,478 B2 | 9/2006 | Grupp et al. |
| 7,176,483 B2 | 2/2007 | Grupp et al. |
| 7,382,021 B2 | 6/2008 | Faulkner et al. |
| 7,462,860 B2 | 12/2008 | Grupp et al. |
| 7,816,240 B2 | 10/2010 | Faulkner et al. |
| 7,883,980 B2 | 2/2011 | Grupp et al. |
| 7,884,003 B2 | 2/2011 | Grupp et al. |
| 8,110,877 B2 | 2/2012 | Mukherjee et al. |
| 8,212,336 B2 | 7/2012 | Goebel et al. |
| 8,377,767 B2 | 2/2013 | Grupp et al. |
| 8,431,469 B2 | 4/2013 | Grupp et al. |
| 8,586,966 B2 | 11/2013 | Bangsaruntip et al. |
| 8,647,960 B2 | 2/2014 | Deweerd et al. |
| 8,658,523 B2 | 2/2014 | Faulkner et al. |
| 8,766,336 B2 | 7/2014 | Grupp et al. |
| 8,916,437 B2 | 12/2014 | Grupp et al. |
| 8,952,541 B2 | 2/2015 | Mukherjee et al. |
| 9,123,790 B2 | 9/2015 | Pillarisetty et al. |
| 9,209,261 B2 | 12/2015 | Grupp et al. |
| 9,362,376 B2 | 6/2016 | Harrison et al. |
| 9,978,835 B2 * | 5/2018 | Yang .................. H01L 29/0676 |
| 2001/0028067 A1 | 10/2001 | Awano |
| 2002/0061646 A1 | 5/2002 | Kan et al. |
| 2002/0158250 A1 | 10/2002 | Fujisaki et al. |
| 2002/0175386 A1 | 11/2002 | Kim |
| 2003/0009463 A1 | 1/2003 | Gallant |
| 2003/0012146 A1 | 1/2003 | Novaes |
| 2003/0022474 A1 | 1/2003 | Grover et al. |
| 2003/0121468 A1 | 7/2003 | Boone et al. |
| 2003/0127700 A1 | 7/2003 | Moddel et al. |
| 2003/0132466 A1 | 7/2003 | Shin et al. |
| 2003/0219965 A1 | 11/2003 | Cabral et al. |
| 2003/0235936 A1 | 12/2003 | Snyder et al. |
| 2004/0026687 A1 | 2/2004 | Grupp et al. |
| 2004/0142524 A1 | 7/2004 | Grupp et al. |
| 2005/0009302 A1 | 1/2005 | Wakui et al. |
| 2005/0037557 A1 | 2/2005 | Doczy et al. |
| 2005/0093027 A1 | 5/2005 | Grupp et al. |
| 2005/0104137 A1 | 5/2005 | Faulkner et al. |
| 2005/0104152 A1 | 5/2005 | Snyder et al. |
| 2008/0128760 A1 | 6/2008 | Jun et al. |
| 2008/0315256 A1 | 12/2008 | Ohta et al. |
| 2011/0092047 A1 | 4/2011 | Gaines et al. |
| 2012/0280294 A1 | 11/2012 | Grupp et al. |
| 2012/0292665 A1 | 11/2012 | Marino et al. |
| 2014/0001520 A1 | 1/2014 | Glass et al. |
| 2014/0035059 A1 | 2/2014 | Giles et al. |
| 2014/0041722 A1 | 2/2014 | Liang et al. |
| 2014/0135209 A1 | 5/2014 | Kaburagi et al. |
| 2014/0284666 A1 | 9/2014 | Grupp et al. |
| 2015/0067413 A1 | 3/2015 | Tripathi et al. |

FOREIGN PATENT DOCUMENTS

| | | |
|---|---|---|
| WO | WO 2004/015782 A1 | 2/2004 |
| WO | WO 2004/030104 A1 | 4/2004 |
| WO | 2013/095343 A1 | 6/2013 |

OTHER PUBLICATIONS

Aberle, Armin G., et al., "Injection-Level Dependent Surface Recombination Velocities at the Silicon-Plasma Silicon Nitrite Interface", Institute fur Solarenergieforschung, ISFH, D-3 1860 Emmerthal, Germany, (Mar. 9, 1995), pp. 2828-2830.

(56) References Cited

OTHER PUBLICATIONS

Aboelfotoh, "Influence of thin interfacial silicon oxide layers on the Schottky-barrier behavior of Ti on Si(100)", Phys Rev B Condens Matter (Mar. 1989), 39(8):5070-5078.
Acorn Technologies, Inc., International Application No. PCT/US2012/060893 filed Oct. 18, 2012, ISA/US, International Search Report and Written Opinion, dated Dec. 11, 2012, 23 pages.
Adam; et al., "Experimental Identification of Nitrogen-Vacancy Complexes in Nitrogen Implanted Silicon", Applied Physics Letters (Jul. 2001), 79(5):623-625.
Agrawal; et al., "Fermi level depinning and contact resistivity reduction using a reduced titania interlayer in n-silicon metal-insulator-semiconductor ohmic contacts", Applied Physics Letters (2014), 104(11):112101-1-112101-4.
Alers; et al., "Effects of Thermal Stability and Roughness on Electrical Properties of Tantalus Oxide Gates", MRS Proceedings (1999), 567:391-395.
Almeida; et al., "Reaction-Diffusion Model for Thermal Growth of Silicon Nitrite Films on Si", Physical Review B (Dec. 2000), 62(24):R16255-R16258.
Bannikov; et al., "Field-Effect Transistor With Metal-(Tunneling-Insulator)-Semiconductor Contacts and a Gate Insulator Made of A Mangmuir-Blodgett Film", Soviet Technical Physics Letters (Mar. 1989), 15(3):211-212.
Bauernschmitt, et al., "Transition from MOS to Schottky-contract behaviour in Yb—SiO2—Si Tunneling Junctions with extremely thin SiO2 layer", Microelectronic Engineering (1993), 22:105-108.
Baumvol, "Atomic Transport During Growth of Ultrathin Dielectrics on Silicon", Surface Science Reports (Dec. 1999), 36(1-8):1-166.
Berger, "Contact Resistance and Contact Resistivity" J. Electrochem. Soc.: Solid-State Science and Technology (1972), 119(4):507-514.
Blosse; et al., "A Novel Low Cost 65nm CMOS Process Architecture With Self Aligned Isolation and W Cladded Source/Drain", IEEE, Transactions of 2004 International Electron Device Meeting (Jan. 2005), pp. 669-672.
Bringans, "Arsenic Passivation of Si and Ge Surfaces", Critical Reviews in Solid State and Materials Sciences 1(1992), 17(4):353-395.
Cai; et al., "Investigation of the Properties of Plasma-Enhanced Chemical Vapor Deposition Silicon Nitride and its Effect on Silicon Surface Passivation", Journal of Applied Physics (May 1998), 83(11):5885-5889.
Card; et al., "Studies of tunnel MOS diodes I. Interface effects in silicon Schottky diodes", Journal of Physics D: Applied Physics (1971), 4(10):1589-1601.
Chadi; et al., "Fermi-Level-Pinning Defects in Highly n-Doped Silicon", Physical Review Letters (Dec. 1997), 79(24):4834-4837.
Chaneliere; et al., "Tantalum Pentoxide (Ta2O5) Thin Films for Advanced Dielectric Applications"; Materials Science and Engineering, R: Reports (May 1998), 22(6):269-322.
Chen; et al., "High Quality Native-Oxide-Free Ultrathin Oxide Grown by In-Situ HF-Vapor Treatment", Electronic Letters, (May 2000), 36(11):981-983.
Connelly; et al., "Optimizing Schottky S/D Offset for 25-nm Dual-Gate CMOS Performance", Electron Device Letters, IEEE (Jun. 2003), 24(6)411-413.
Edelstein; et al., "Full Copper Wiring in a Sub-0.25 mm CMOS ULSI Technology", Proceedings of the IEEE International Electron Device Meeting (1997), pp. 773-776.
Gilmer; et al., "Process and Manufacturing Challenges for High-K Gate Stack Systems", MRS Proceedings, MRS Spring Meeting (1999), 567:323-341.
Gopalakrishnan; et al., "Impact Ionization MOS (I-MOS)-Part I: Device and Circuit Simulations", IEEE Transactions Electron Devices (Jan. 2005), 52(1):69-76.
Hara, et al., "Control of Schottky and Ohmic Interfaces by Unpinning Fermi Level", Applied Surface Science (1997), 117-118:394-399.
Hara; et al., "Pinning-Controlled Metal/Semiconductor Interfaces", Proc. SPIE 2779, 3rd International Conference on Intelligent Materials and 3rd European Conference on Smart Structures and Materials (Apr. 1996), 2779:802-807.
Hara; et al., "Pinning-Controlled Ohmic Contacts: Application to SiC(0001)", Applied Surface Science (Nov. 1996), 107:218-221.
Hasegawa; et al., "Unpinning of Fermi Level in Nanometer-Sized Schottky Contacts on GaAs and InP", Applied Surface Science (2000): 166:92-96.
Hayafuji; et al., "Nitridation of Silicon and Oxidized-Silicon", J. Electrochem. Soc. (1982), 129(9):2102-2108.
Heine, "Theory of Surface States", Physical Review (Jun. 1965), 138(6A):83-4.
Hilsenbeck; et al., "Aging Behavior of Algan HFETs With Advanced Ohmic and Schottky Contacts", Electronic letters (May 2000), 38(11):980-981.
Huang, "Metal-Oxide Semiconductor Field-Effect Transistors Using Schottky Barrier Drains", Electronics Letters (1797), 33(15):1341-1342.
Huang; et al., "Two-Dimensional Numerical Simulation of Schottky Barrier MOSFET with Channel Length to 10 nn", IEEE (Apr. 1998), pp. 842-848.
International Search Report and Written Opinion of the International Searching Authority, Patent Cooperation Treaty (dated Mar. 2, 2006), PCT/US2005/030209, 6 pgs.
International Search Report, Patent Cooperation Treaty (dated Dec. 18, 2003), PCT/US03/25057, 4 pgs.
International Search Report, PCT/US2004/042084, dated Sep. 1, 2005, 4 pgs.
Izumi, "43 Hydrogen Termination: The Ideally Finished Silicon Surface", Ultraclean Surface Processing of Silicon Wafers (1998), pp. 559-565.
Kamins; et al., "Effect of Hydrogen on p-Type Epitaxial Silicon Sheet-Resistance Measurements", Electrochemical and Solid-State Letters (1998), 1(2):100-101.
Kamiyama; et al., "Ultrathin Tantalum Odise Capacitor Dielectric Layers Fabricated Using Rapid Thermal Nitridation Prior to Low Pressure Chemical Vapor Deposition", J. Electrochem Soc. (1993), 140(6)1617.
Kaxiras, "Efthimios. Semiconductor-surface restoration by valence-mending adsorbates: Application to Si (100): S and Si (100): Se", Phys Rev B Condens Matter (Mar. 1991), 43(18):6824-6827.
Kedzierski; et al., "Extension and Source/Drain Design for High-Performance FinFET Devices", IEEE Trans. Electron Devices (Apr. 2003), 50(4):952-958.
Keller; et al., "Calculations of the barrier height and charge distribution of a metal-dielectric interface", Journal of Vacuum Science & Technology A: Vacuum, Surfaces, and Films (Jul. 1992), 10(4):775-780.
Kim; et al., "Metal-Dependent Fermi-Level Movement in the Metal/Sulfer-Passivated InGaP Contact", Journal of Vacuum Science & Technology A: Vacuum, Surfaces, and Films (1997), 15(3):1124-1128.
Kimura; et al., "A New Type of Schottky Tunnel Transistor", IEEE Electron Device Letters (Oct. 1994), 15(10): 412-414.
Lee; et al., "Electronic Property of Metallic Nanoclusters on Semiconductor Surfaces: Implications for Nanoelectronic Device Applications", Journal of Nanoparticle Research (Dec. 2000), 2(4):345-362.
Louie; et al., "Ionicity and the Theory of Schottky Barriers", Physical Review B (Feb. 1977), 15(4):2154-2162.
Majumdar; et al., "Statistical demonstration of silicide-like uniform and ultra-low specific contact resistivity using a metal/high-k/Si stack in a sidewall contact test structure", 2014 Symposium on VLSI Technology Digest of Technical Papers (Jun. 9-12, 2014), INSPEC Accession Number: 14582372, 0743-1562, 2 pgs.
Mandelis; et al., "Evidence of a Surface Acceptor State in Undoped Semi-Insulating GaAs by Photothermal Radiometric Deep Level Transient Spectroscopy", Sociedad Mexicana de Ciencias de Superficies y de Vacio, (1999), 8:13-17.
Martel; et al., "Ambipolar Single-Wall Carbon Nanotube Transistors and Inverters", AIP Conference Proceedings (Mar. 2001). 591:543-547.

(56) References Cited

OTHER PUBLICATIONS

McKee; et al., "Physical Structure and Inversion Charge at a Semiconductor Interface With a Crystalline Oxide", Science (Jul. 2001), 293(5529):468-471.
McKinley; et al., "Controlled modification of heterojunction band lineups by diffusive intralayers", Journal of Vacuum Science & Technology A Vacuum Surfaces and Films (May/Jun. 1990), 8(3):1917-21.
Miyawaki; et al., "Improvement of Aluminum-Si Contact Performance in Native-Oxide-Free Processing", IEEE Electron Device Letters (Oct. 1990), 11(10):448-450.
Nauka; et al., "Surface Photovoltage Measurement of Hydrogen-Treated Si Surfaces", Journal of Electrochemical Society (1999), 146(1):292-295.
Nishioka; et al., "Dielectric Characteristics of Fluorinated Ultradry SiO2", Appl. Phy. Letters (Mar. 1989), 54(12):1127-1129.
Okamoto; et al., "Near-Ohmic Contact of n-GaAs with GaS/GaAs Quaisi-Metal-Insulator-Semiconductor Structure", Jpn. J. Appl. Phys. (1998), 37:3248-3251.
Padovani, "Forward Voltage-Current Characteristics of Metal-Silicon Schottky Barriers", Journal of Applied Physics (1967), 38(2):891-892.
Park; et al., "Thermal stability of molybdenum-silicon nitride-silicon Schottky diodes", Journal of Applied Physics (Mar. 1991), 69(5):3149-3153.
Patel; et al., "Arsenic Atom Location on Passive Silicon (111) Surfaces", Physical Review B (Nov. 1987), 36(14):7715-17.
Patents Act 1977: Examination Report under Section 18(3), UK Intellectual Property Office dated Apr. 29, 2015, Application No. GB1409999.8 (filed Oct. 18, 2012), 5 pgs.
Porter; et al., "A Critical Review of Ohmic and Rectifying Contacts for Silicon Carbide", Material Science and Engineering: B (Nov. 1995), 34(2-3):83-105.
Ren; et al. "Metal I Silicon Schottky Barrier Lowering by RTCVD Interface Passivation" Electrochemical Society Proceedings (2000), 2000-9:161-166.
Ruzyllo; et al., "Semiconductor Glossary an Introduction to Semiconductor Terminology", Prosto Multimedia Publishing (2004), pp. 26.
Schmidt; et al., "Carrier Recombination at Silicon—Silicon Nitride Interfaces Fabricated by Plasma-Enhanced Chemical Vapor Deposition", Journal of Applied Physics (Apr. 1999), 85(7):3626-3633.
Shalish; et al., "Yellow Luminescence and Fermi Level Pinning in GaN Layers", Appl Phys Lett (Aug. 2000), 77(7):987-989.
Snyder; et al., "Experimental Investigation of a PtSi Source and Drain Field Emission Transister", Appl Phys Lett (1995), 67:1420-1422.
Sobolewski; et al., "Properties of Ultrathin Thermal Nitrides in Silicon Schottky Barrier Structures", Applied Physics Letters, American Institute of Physics (1989), 54(7):638-640.
Sobolewski; et al., "Studies of barrier height mechanisms in metal-silicon nitride-silicon Schottky barrier diodes", Journal of Vacuum Science & Technology B (1989), 7:971-979.
Spicer; et al., "Unified Mechanism for Schottky-Barrier Formation and III-V Oxide Interface States", Physical Review Letters (Feb. 1980), 44(6):420-423.
Sze, "Metal-Semiconductor Contacts", Physics of Semiconductor Devices, John Wiley & Sons, (1981), pp. 245-311.
Takahagi; et al., "The formation of hydrogen passivated silicon singlecrystal surfaces using ultraviolet cleaning and HF etching", J Appl Phys (1988), 64(7):3516-21.
Tao; et al., "Removal of dangling bonds and surface states on silicon (001) with a monolayer of selenium", Applied Physics Letters (Mar. 2003), 82(10)1559-1561.
Tao; et al., "Suppression of silicon (001) surface reactivity using a valence-mending technique", Solid State Communications (Oct. 2004), 132(2):89-92.
Taubenblatt; et al., "Interface effects in titanium and hafnium Schottky barriers on silicon", Appl Phys Lett (May 1984), 44:895-897.
Teraji; et al., "Ohmic Contacts to n-Type 6H-SiC Without Post-Annealing", Material Research Society, MRS Spring Meeting (1996), 423:149-154.
Tersoff, "Schottky Barrier Heightsand the Continuum of Gap States", Physical Review Letters (Feb. 1984), 52(6):465-468.
Thanailakis; et al., "Transition-metal contacts to atomically clean silicon, Department of Electrical Engineering and Electronics", Journal of Physics C: Solid State Physics (1976), 9:337-343.
Thompson; et al., "A Logic Nanotechnology Featuring Strained-Silicon", IEEE Electron Device Letters (Apr. 2004),25(4):191-193.
Tung, "Electron Transport of Inhomogeneous Schottky Barriers", Appl Phys Letter (1991), 58(24):2821-2823.
Udeshi; et al., "Thermal stability of ohmic contacts between Ti and Sepassivated n-type Si(001)", J Appl Phys (2004), 95(8):4219-4222.
Uemoto, "Reduction of Ohmic Contact Resistance on N-Type 6H-SIC by Heavy Doping", Japanese Journal of Applied Physics (Jan. 1995), 34(Parts 2, No. 1A).
Verhaverbeke; et al., "Surface Characterization of Si After HF Treatments and its Influence in the Dielectric Breakdown of Thermal Oxides", MRS Proceedings (1992), 259:391-399.
Wang; et al., "High Barrier GaN Schottky Diodes: Pt/GaN and Pd/GaN", Appl. Phys. Letters (Feb. 1996), 68(9):1267-1270.
Wei; et al., "The Use of Selective Electroless Metal Deposition for Micron Size Contact Fill", IEEE International Electron Device Meeting Technical Digest (1988), pp. 446-449.
Weinberger; et al., "Surface Chemistry of HF Passivation Silicon: X-Ray Photoelectron and Ion Scattering Spectroscopy Results", J. Appl. Phys (Nov. 1986), 60(9):3232-34.
Widjaja; et al., "Ab Initlo Study and Decomposition of NH3 on Si(100)-(2x1)", J. Phy. Chem B, (2000), 104:2527-2533.
Wittmer; et al., "Ideal Schottky diodes on passivated silicon", Phys Rev Lett (Nov. 1992), 69(18):2701-2704.
Wolf; et al., "Spintronics: A Spin-Based Vision for the Future", Science (Nov. 2001), 294(5546):1488-95.
Wright; et al., "Hot-Electron Immunity of SiO2 Dielectrics with Fluorine Incorporation", IEEE Electron Device Letters (1989), 10(8):347-348.
Yablonovitch; et al., "Unusually Low Surface-Recombination Velocity on Silicon and Germanium Surfaces", Physical Review Letters (Jul. 1986), 57(2):249-252.
Yagishita; et al., "High Performance Damascene Metal Gate MOSFET's for 0.1 mm Regime", IEEE Trans. Electron Devices (2000), 47(5):1028-1034.
Yang; et al., "The Effects of Interfacial Sub-Oxide Transition Regions and Monolayer Level Nitridation on Tunneling Currents in Silicon Devices", IEEE Electron Device Letters (2000), 21(2):76-78.
Yu, Hao, et al., "Thermal Stability Concern of Metal-Insulator-Semiconductor Contact—A Case Study of Ti/TiO$_2$/n-Si Contact", IEEE Transactions on Electron Devices (2016), 6 pages.
Zhang; et al., "Schottky diodes of NiŌAu on n-GaN grown on sapphire and SiC substrates", Applied Physics Letters (Oct. 2001), 79(16):2567-69.
Zhu; et al., "Low-Resistance Ti/n-Type Si(100) Contacts by Monolayer Se Passivation", ECS Trans (2006), 2(2):401-409.
Zhu; et al., "Stability of Se passivation layers on Si(001) surfaces characterized by time-of-flight positron annihilation induced Auger electron spectroscopy", Journal of Applied Physics (2005), 97(10):103510-1103510-4.
Connelly; et al, "Improved Short-Channel n-FET Performance with Virtual Extensions," Abstracts of the 5th International Workshop on Junction Technology (2005), 4 pages.
Fischer, S.; et al., "Dopant-free complementary metal oxide silicon field effect transistors," Phys. Status Solidi A 213, No. 6, pp. 1494-1499 (2016).
Heinzig; et al., "Reconfigurable Silicon Nanowire Transistors," Nano Letters, vol. 12, pp. 119-124 (2012).
Martinez; et al., "Quantum-Transport Study on the Impact of Channel Length and Cross Sections on Variability Induced by Random Discrete Dopants in Narrow Gate-All-Around Silicon Nanowire Transistors," IEEE Trans. Electron Devices, 58(8):2209-2217 (2011).

(56) References Cited

OTHER PUBLICATIONS

McKinley; et al., "Control of Ge homojunction band offsets via ultrathin Ga—As dipole layers," Applied Surface Science vol. 56-58, pp. 762-765 (1992).

McKinley; et al., "Control of Ge homojunction band offsets via ultrathin Ga—As dipole layers," J. Vac. Sci. Technol. A 9(3):917-21, May/Jun. 1991.

Park, S.-H.; et al., "Scaling effect on specific contact resistivity in nano-scale metal-semiconductor contacts", 16th Int'l Workshop on Computational Electronics, Nara, Japan (Jun. 4-7, 2013), pp. 134-35.

Park, S.-H.; et al., "Scaling effect on specific contact resistivity in nano-scale metal-semiconductor contacts", Proc. Device Research Conference (2013), pp. 125-26.

International Search Report and Written Opinion dated Mar. 8, 2018, from the ISA/European Patent Office, for International Patent Application No. PCT/US2017/062296 (filed Nov. 17, 2017), 22 pages.

Tao; et al., "Negative Schottky barrier between titanium and n-type Si(001) for low-resistance ohmic contacts", Solid State Electron (Feb. 1, 2004), 48(2):335-338.

International Preliminary Report on Patentability dated Oct. 19, 2018, from the IPEA/US, for International Patent Application No. PCT/US2017/062296 (filed Nov. 17, 2017), 14 pages.

\* cited by examiner

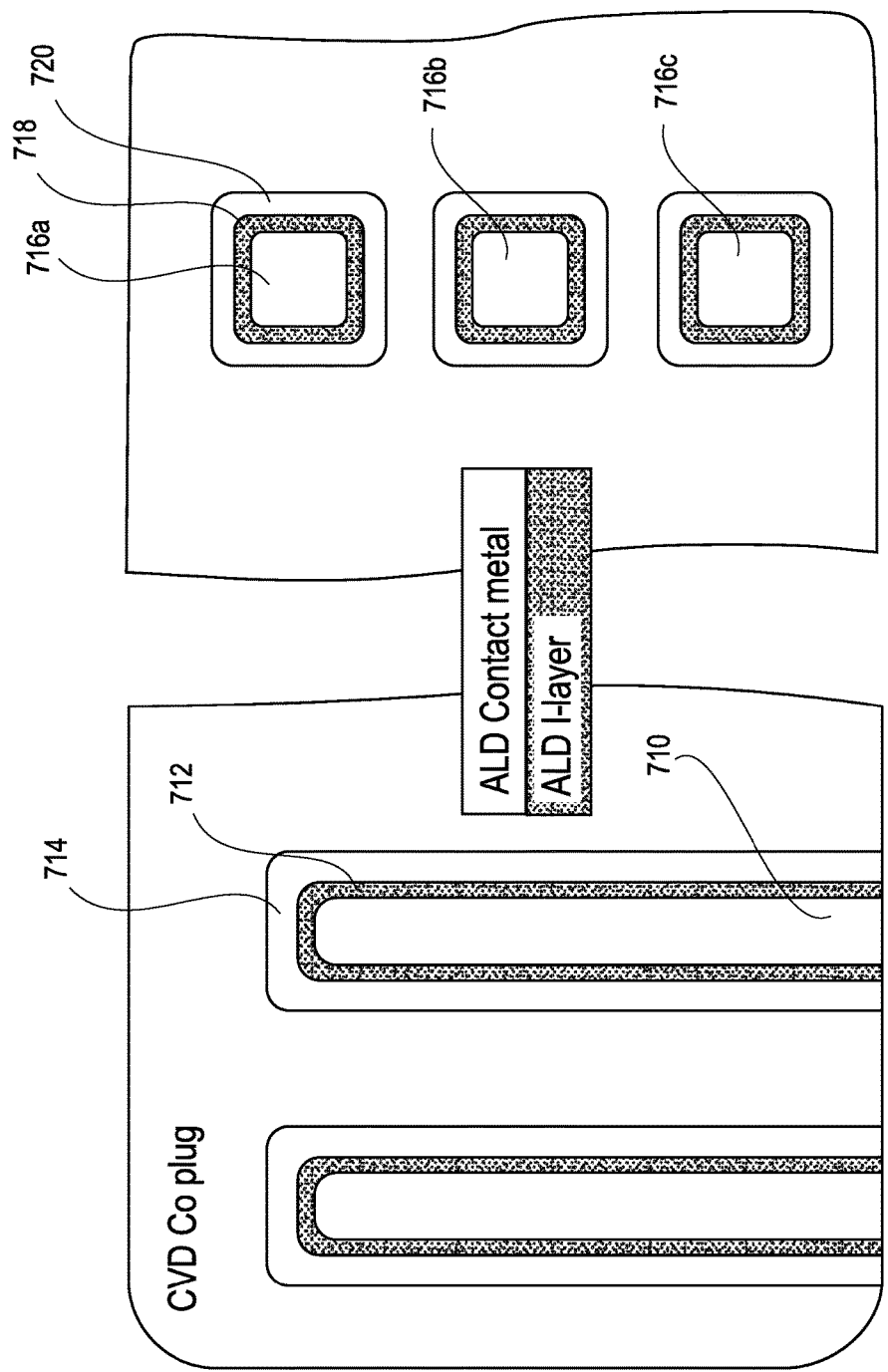

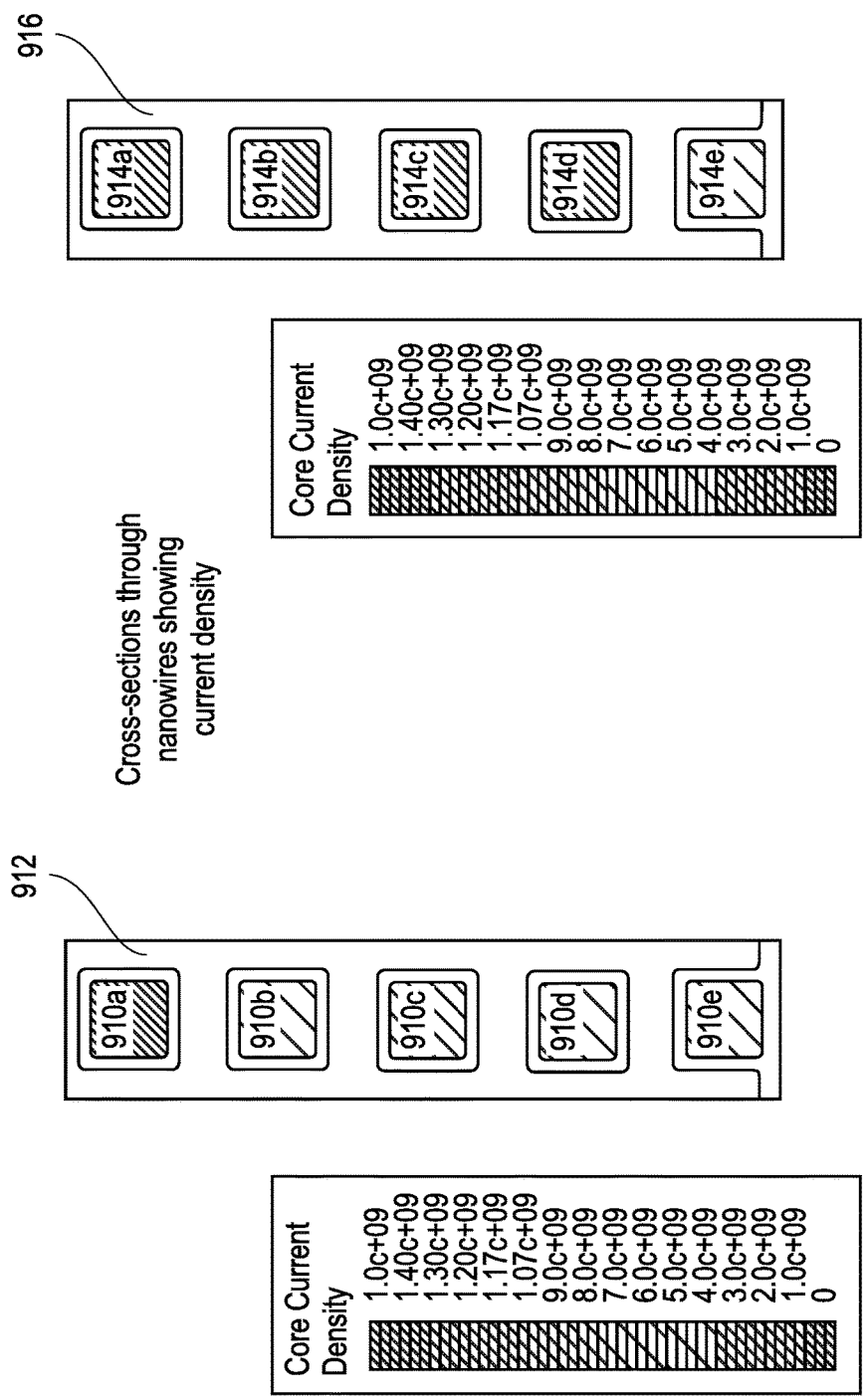

NANOWIRE TRANSISTOR WITH SOURCE AND DRAIN INDUCED BY ELECTRICAL CONTACTS WITH NEGATIVE SCHOTTKY BARRIER HEIGHT

RELATED APPLICATIONS

This is a NONPROVISIONAL of and incorporates by reference: (a) U.S. Provisional Application No. 62/424,176, filed Nov. 18, 2016, and (b) U.S. Provisional Application No. 62/456,437, filed Feb. 8, 2017.

FIELD OF THE INVENTION

The present invention relates to semiconductor devices (e.g., diodes, transistors, etc.) having a region of undoped semiconductor material that is made effectively n-type or p-type by inducing a quantity of electrons or holes (respectively) on the semiconductor side of a metal-semiconductor junction by virtue of a negative Schottky barrier between the metal and the semiconductor.

BACKGROUND

With continued scaling of metal oxide semiconductor (MOS) field effect transistors (FETs), the area available for making electrical contacts to doped semiconductor source/drain regions is decreasing. As a consequence, the resistance of such contacts (which are typically metal-to-semiconductor contacts) is becoming an excessively large component of the total electrical resistance of a transistor when it is switched on. This undesired metal-semiconductor contact resistance is becoming a very significant performance limiting factor for such devices, contributing both to wasted energy and reduced switching speeds (clocking rates) in digital integrated circuits comprising such transistors. Furthermore, the decreasing volume of doped source and drain regions in state of the art transistors accommodates fewer dopant atoms, even at very high doping concentrations in excess of $10^{20}$ dopants/cm$^3$. As a consequence, the variability in transistor performance that is a result of variance in doping species number and placement is predicted to become a significant problem in future, nanometer-scale MOS transistors, particularly in anticipated, gate-all-around nanowire transistors.

FIG. 1 shows an example of a gate-all-around nanowire transistor 10. In this example, a gate wraps completely around a semiconductor channel. A gate oxide is disposed concentrically between the gate and the channel. Doped semiconductor source and drain regions are located at opposite ends of the channel and have associated circumferential contacts, typically metal silicide contacts, separated from the gate contact by an gate sidewall spacer.

Contact resistance is conventionally calculated as "contact resistivity" divided by the area of the contact. Traditionally therefore contact resistance has been minimized by ensuring as low a contact resistivity and as large a contact area as technologically possible. According to Park et al., "Scaling effect on specific contact resistivity in nano-scale metal-semiconductor contacts", Proc. Device Research Conference (2013), however, "initial results indicate that contact resistivity increases in the limit of very small contact areas and that the effect is stronger in the 3D wire case compared to the 2D wire case." Contact resistance of metal-semiconductor contacts is expected to increase even more than a classical model would predict in the size regime of 10 nm and smaller due to the two-fold effects of increasing resistivity and decreasing contact area. There is then a serious metal-semiconductor contact resistance problem for present and future nanoscale transistors that have contact dimensions of approximately 10 nm or less.

Furthermore, in present day, state-of-the-art transistors, at nodes smaller than 20 nm, the semiconductor channel is fully depleted, whether the transistors are fully-depleted silicon-on-insulator (FDSOI) FETs, FinFETs, "tri-gate FETs", nanowire FETs or gate-all-around FETs. Fully depleted implies that the thickness of the semiconductor body that includes the channel and the parts of the source/drain adjoining the channel are extremely thin, typically less than 12 nm or so. The parts of the source and drain that adjoin the channel may have a very small volume. When such transistors have conventional doped source/drain regions, the number of dopant atoms in the source and drain regions proximate to the channel may be of the order of ten or fewer and these dopants will have random placement. As such, the doping in any given transistor is stochastic rather than deterministic and this can lead to excessive variability in the electrical performance of a population of transistors that form an integrated circuit.

To explain this problem in more detail, even at high doping levels in excess of $10^{20}$ dopant/cm$^3$, the dopants are sparse, at most comprising only 2% of the atoms present in the source/drain regions and more typically less than 1%. It has been recognized that when the volume of source/drain regions is small, the statistical variation of the number and location of the dopant atoms introduces a very large variance in the electrical responses of the transistors. See, e.g., Martinez et al., "Quantum-Transport Study on the Impact of Channel Length and Cross Sections on Variability Induced by Random Discrete Dopants in Narrow Gate-All-Around Silicon Nanowire Transistors," IEEE Trans. Electron Devices, Vol. 58, No. 8, p. 2209 (2011). In this article, the authors point out that a transistor with an unfortunate configuration of dopant atoms in source/drain can have both an undesirably high "off" current (under zero gate bias) and an undesirably low "on" current (under high gate bias) relative to a transistor with a more favorable configuration of dopant atoms. In designing an integrated circuit, often comprising several billion transistors, it is the "weak" transistors that determine the performance of the whole circuit. That is, to obtain high yields of manufactured ICs it is necessary to design the circuit assuming transistors are the inferior or weak type. Stated differently, the performance of a circuit is determined by the weakest of the transistors rather than the strongest. In modern statistical design of circuits, the dependence is more nuanced but it is generally true that given a statistical distribution of device characteristics across a large population of transistors, the performance of a circuit is determined more by the low performance of the weaker transistors than the high performance of the stronger transistors. What is preferred is to have a population of transistors with the variance in their electrical performance as small as possible.

Quite apart from the severe contact resistance problem associated with nanoscale metal-semiconductor contacts, the statistical variance of source/drain doping thus presents another major challenge to further scaling of MOS transistors into the 7 nm node and beyond. Metal source/drain transistors provide a solution to the dopant variability problem in conventional doped source/drain technologies. Dopants can be eliminated if the source/drain regions are formed of a metal that adjoins the undoped channel region and provides carriers to the channel directly without any need for doped semiconductor. Such metal source/drain regions most desirably have a small Schottky barrier height in order for their performance to be competitive with doped source/drain counterparts.

U.S. Pat. Nos. 6,833,556, 7,084,423, 7,112,478, 7,883,980, and 9,362,376, all assigned to the assignee of the present invention and each incorporated herein by reference, describe methods and structures that enable high performance metal source/drain field effect transistors. Briefly, an electrical junction includes an interface layer disposed between a contact metal and a semiconductor, and may comprise a passivation layer (which in some instances may be a monolayer) adjacent the semiconductor and, optionally, a separation layer disposed between the passivation layer and the metal. Various metals and semiconductors may be used, and the passivation layer may be an oxide of the semiconductor or other material. The separation layer, if present, may be a metal oxide. The very thin, interfacial dielectric layer between the metal and semiconductor acts to reduce the Schottky barrier at the junction from that which would exist in the absence of the interface layer, and at the same time has sufficient conductivity, despite being itself a dielectric with poor bulk electrical conduction, to provide a net improvement in the conductivity of the MIS junction. These devices overcome the statistical dopant variability problem by eliminating source/drain doping completely. However, these devices do have a remaining limitation in that the area of the metal-semiconductor interface, where a metal source or drain adjoins the semiconductor channel, is exceedingly small, being broadly comparable to the cross sectional area of the channel. U.S. Pat. No. 8,212,336 provides a solution that offers some relief to the area limitation by providing an interface that has an area exceeding the cross-sectional area of the channel.

It is known to induce "virtual" p-type and n-type regions using MOS capacitors. Such MOS capacitors are not conductive and do not provide a current to the semiconductor. The MOS capacitors induce variously (and optionally) p-type or n-type semiconductor regions. Electrical current into or out of these regions is provided by other (additional) electrical contacts. See e.g., André Heinzig et al., "Reconfigurable Silicon Nanowire Transistors", Nano Letters, Vol. 12, pp. 119-124 (2012).

FIGS. 6A and 6B are reproduced from FIGS. 6a and 6c, respectively, of U.S. Pat. No. 6,891,234, assigned to the assignee of the present invention, and illustrate induced charge regions in various transistor configurations. In both cases "virtual extensions" are induced under "overlap M" regions of low work function metals (for n-channel devices) or high work function metals (for p-channel). An "overlap M" region is described as: "a conductor (in this case a metal) 92 that overlaps an extension region 94 between the source and/or drain regions 96 and the channel region 98. This conductor 92 is separated from the extension region 94 by an insulator 100 and is chosen to have a workfunction that will induce a desired polarity and concentration of charge in the extension region 94." Further, the "overlap M" regions are connected to the source/drain metal regions as also described: "In illustration 6(c), transistor 113, configured in accordance with an embodiment of the present invention, has virtual extensions 114 from the n+S/D regions 115 that result from the use of the overlapping metal 118. These metal layers 118 are connected to the metal S/D contacts 116 and are separated from the extension regions 114 and the gate 119 by an insulator 120."

Regarding the work-functions of the overlap metals, the '234 patent states: "In one embodiment of the present invention, the conductor used to overlap the extension region is a metal possessing a low workfunction $\Phi_x$ in an n-channel FET. This effective workfunction is considered low when it is less than the electron affinity $X_c$ of the semiconductor. It is generally advantageous to have $\Phi_x$ as low as possible. The lower the workfunction, the greater the amount of charge (in this case electrons) induced in the extension, which generally reduces the resistance of the extension region, generally advantageously increasing the drive-current capability of the transistor. In another embodiment of the present invention, the workfunction $\Phi_x$ of the metal is high in a p-channel FET, where $\Phi_x$ is greater than the hole affinity of the semiconductor (i.e., more than a bandgap greater than the semiconductor's electron affinity). The overlapping metal in this case induces holes in the extension region. It is generally advantageous to have a metal with as high a workfunction as possible. The workfunction of the metal lies outside of the semiconductor bandgap."

Connelly et al., "Improved Short-Channel n-FET Performance with Virtual Extensions," Abstracts of the 5th International Workshop on Junction Technology (2005) reports: "An alternative to purely doped S/D extensions is to form a charge layer electrostatically, of thickness comparable to the channel thickness of just a few nanometers. One approach, separately biased spacers, results in additional wiring complexity and capacitance. A better approach to electrostatically induced "virtual extensions" is . . . to overlay a metal of appropriate work function above the extension regions to induce such a mobile charge layer, a "virtual extension" . . . this creates a zero-bias MOS capacitor in the extension regions, where, for an n-FET, a negative $V_T$ results in a permanently induced charge layer that provides an ultrashallow tip to conventional S/D doping profiles." "[T]his "virtual extension" tip can reduce the electrostatic coupling between a S/D and the channel . . . . The metal in the thin "overlap metal" had a work function of 3V (n-FET), comparable to Er or Yb. The virtual extension thus provides an ultra-thin sheet of charge." In this paper, the exemplary virtual extension structure was modeled with an "extension oxide thickness" of 0.7 nm, an identical "gate oxide thickness" of 0.7 nm and an "overlap metal effective workfunction" equal to 3 V. It is implied therefore that there is no current flow between the overlap metal and the semiconductor just as there is no current flow between the gate metal and the semiconductor.

U.S. Pat. Nos. 8,586,966 and 9,123,790 describe making contacts to FinFETs and nanowire source/drains. U.S. Pat. No. 8,586,966 states: "a nanowire field effect transistor (FET) device includes a channel region including a silicon nanowire portion having a first distal end extending from the channel region and a second distal end extending from the channel region, the silicon portion is partially surrounded by a gate stack disposed circumferentially around the silicon portion, a source region including the first distal end of the silicon nanowire portion, a drain region including the second distal end of the silicon nanowire portion, a metallic layer disposed on the source region and the drain region, a first conductive member contacting the metallic layer of the source region, and a second conductive member contacting the metallic layer of the drain region." Doped source/drain regions are used: "The source and drain diffusion regions may include either N type (for NMOS) or P type (for PMOS) doped with, for example, As or P (N type) or B (P type) at a concentration level typically 1e19 atoms/cm³ or greater."

Similarly, U.S. Pat. No. 9,123,790 reports on "forming a contact coupled with the channel layer, the contact being configured to surround, in at least one planar dimension, material of the channel layer and to provide a source terminal or drain terminal for the transistor." "In some embodiments, forming the contact further includes epitaxially depositing an epitaxial film on the channel layer prior to depositing the metal to form the contact, the epitaxial film being configured to surround, in the at least one planar dimension, the material of the channel layer and being disposed between the material of the channel layer and material of the contact." In the specification, various doping methods are described: "The source and drain regions may be formed using either an implantation/diffusion process or an etching/deposition process. In the former process, dopants such as boron, aluminum, antimony, phosphorous, or arsenic may be ion-implanted into the substrate to form the source and drain regions. The ion implantation process is typically followed by an annealing process that activates the dopants and causes them to diffuse. In the latter process, materials of the stack of layers may first be etched to form recesses at the locations of the source and drain regions. An epitaxial deposition process may then be carried out to fill the recesses with a silicon alloy such as silicon germanium or silicon carbide, thereby forming the source and drain regions. In some implementations the epitaxially deposited silicon alloy may be doped in situ with dopants such as boron, arsenic, or phosphorous. In further implementations, alternate materials may be deposited into the recesses to form the source and drain regions, such as germanium or a group III-V material or alloy."

Fischer, S. et al., "Dopant-free complementary metal oxide silicon field effect transistors," Phys. Status Solidi A 213, No. 6, pp. 1494-1499 (2016), report on dopant-free CMOS devices utilizing ultrathin silicon nitrides and metals with appropriate work functions to provide n- and p-type semiconductor contacts. The reported silicon nitride layers are thicker than a monolayer (e.g., on the order of 7-27 Angstroms), and there is no mention of a negative Schottky barrier between the metal contact and the semiconductor.

SUMMARY OF THE INVENTION

In one embodiment of the invention, a nanowire transistor includes a nanowire disposed on a substrate, wherein a longitudinal length of the nanowire is made up of an undoped channel region of a first semiconductor material, an undoped semiconductor source region electrically coupled with a first end of the channel region, an undoped semiconductor drain region electrically coupled with a second end of the channel region, a gate stack including a gate insulator and a gate conductor coaxially wrapping completely around the channel region, a source stack including an interfacial layer and a source conductor that is electrically isolated from the gate conductor, coaxially wrapping completely around the semiconductor source region and extending along at least a portion of the semiconductor source region, and a drain stack comprising an interfacial layer and a drain conductor that is electrically isolated from the gate conductor, coaxially wrapping completely around the semiconductor drain region and extending along at least a portion of the semiconductor drain region. A Schottky barrier between the source conductor and the semiconductor source region is a negative Schottky barrier and a concentration of free charge carriers is induced in the semiconductor source region. A Schottky barrier between the drain conductor and the semiconductor drain region may, but need not necessarily, be a negative Schottky barrier such that a concentration of free charge carriers is induced in the semiconductor drain region. In some embodiments, the nanowire of the transistor is 20 nm or less thick. In some embodiments, the free charge carriers are electrons (in which case the interfacial layer of the source stack may comprise a monolayer of elements from group V or group VI), while in other embodiments the free charge carriers are holes (in which case the interfacial layer of the source stack may comprise a monolayer of elements from group III or group II).

In various instances of the nanowire transistor, the Schottky barrier between at least one of (a) the source conductor and the semiconductor source region, and (b) the drain conductor and the semiconductor drain region is between −0.1 eV and −0.5 eV. Further, in some instances, the interfacial layer of the source stack and interfacial layer of the drain stack each may include a material that would be an insulator or a semiconductor in its bulk state.

In some instances of the nanowire transistor, the semiconductor channel, the semiconductor source region, and the semiconductor drain region are all comprised of the same semiconductor material. In other instances, however, the semiconductor channel, the semiconductor source region, and the semiconductor drain region are not all comprised of the same semiconductor material. In general, the semiconductor source region may include silicon, germanium, silicon carbide, or an alloy comprising two or more of silicon, germanium, carbon and tin. The interfacial layer of the source stack and interfacial layer of the drain stack each may comprise a monolayer of elements from group V or group VI. A monolayer of group V or group VI atoms causes a negative Schottky barrier for electrons and consequentially a concentration of free electrons is induced in the semiconductor source and/or drain region. Alternatively, the interfacial layer of the source stack and interfacial layer of the drain stack each may comprise a monolayer of elements from group III. A monolayer of group III atoms causes a negative Schottky barrier for holes and consequentially a concentration of free holes is induced in the semiconductor source and/or drain region.

Other embodiments of the invention include a finFET transistor, having a semiconductor fin disposed on a substrate, wherein the fin has two major faces and a longitudinal length of the fin includes: an undoped channel region of a first semiconductor material, an undoped semiconductor source region electrically coupled with a first end of the channel region, an undoped semiconductor drain region electrically coupled with a second end of the channel region, a gate stack comprising a gate insulator and a gate conductor wrapping around at least two sides of the channel region, a source stack comprising an interfacial layer and a source conductor wrapping around at least two sides of the semiconductor source region and extending along at least a portion of the semiconductor source region, and a drain stack comprising an interfacial layer and a drain conductor wrapping around at least two sides of the semiconductor drain region and extending along at least a portion of the semiconductor drain region. A Schottky barrier between the source conductor and the semiconductor source region is a negative Schottky barrier causing a concentration of free carriers to be induced in the semiconductor source region. A Schottky barrier between the drain conductor and the semiconductor drain region may, but need not necessarily, be a negative Schottky barrier such that a concentration of free carriers is induced in the semiconductor drain region. In some embodiments, the fin has a thickness as measured between the two major faces of 12 nm or less.

Still other embodiments of the invention provide a nanowire transistor, which includes: a gate circumferentially surrounding and displaced from a semiconductor nanowire channel by an electrically insulating gate oxide, the semiconductor nanowire channel having no intentional doping; a source at a first end of the nanowire channel, and a drain at a second end of the nanowire channel, the source and drain each comprising undoped semiconductor material; and a first metal contact circumferentially surrounding the source and providing an electrically conductive path to the source, and a second metal contact circumferentially surrounding the drain and providing an electrically conductive path to the drain. The first metal contact electrostatically induces free charge carriers in the source and, in some instances, the second metal contact may, but need not necessarily, electrostatically induce free charge carriers in the drain. The first metal contact is separated from the gate by an insulating material layer or a gap, and the second metal contact is separated from the gate by an insulating material layer or a gap. In some instances of this nanowire transistor the free charge carriers may be electrons, while in other instances the free charge carriers may be holes.

In some embodiments of the nanowire transistor, a Schottky barrier between the first metal contact and the source may have a negative Schottky barrier height. For example, the Schottky barrier between the first metal contact and the source may be between –0.1 eV and –0.5 eV.

In some embodiments of the nanowire transistor, the first metal contact is displaced from the source by a first interface layer, and the second metal contact is displaced from the drain by a second interface layer, the first and second interface layers each comprising a material that would be an insulator or a semiconductor in its bulk state. Also, in some embodiments a first interface layer at an interface between the first metal contact and the source and, optionally, a second interface layer at an interface between the second metal contact and the drain each may comprise a monolayer of elements from group V or group VI.

In some embodiments of the nanowire transistor, the semiconductor nanowire channel, the source, and the drain are may be comprised of the same semiconductor material. The semiconductor material may be silicon, germanium, silicon carbide, a compound semiconductor, a fullerene, or an alloy comprising two or more of silicon, germanium, carbon and tin. In other embodiments, the semiconductor nanowire channel, the source, and the drain are not all comprised of the same semiconductor material.

In still other embodiments of the invention, a nanowire device includes an undoped channel region of a first semiconductor material; an undoped semiconductor source region electrically coupled with a first end of the channel region; an undoped semiconductor drain region electrically coupled with a second end of the channel region; a gate stack comprising a gate insulator and a gate conductor coaxially wrapping completely around the channel region; a source stack electrically isolated from the gate conductor, coaxially wrapping completely around the semiconductor source region and extending along at least a portion of the semiconductor source region; and a drain stack electrically isolated from the gate conductor, coaxially wrapping completely around the semiconductor drain region and extending along at least a portion of the semiconductor drain region; wherein the source stack comprises a source conductor contacting an interfacial layer disposed over the semiconductor source region, the interfacial layer including at least one epitaxial bilayer of group III and group V atomic monolayers.

In such a nanowire device, the source conductor may be a degenerately doped n-type semiconductor, wherein the monolayer of group V atoms is adjacent to and in contact with the source region, the source region comprises a group IV semiconductor source region, and the monolayer of group III atoms is adjacent to and in contact with the degenerately n-type doped semiconductor. The group IV semiconductor and the degenerately doped n-type semiconductor may be different semiconductor materials, or may be the same semiconductor material. For example, where the interfacial layer includes a monolayer of gallium (Ga) atoms and a monolayer of arsenic (As) atoms, the group IV semiconductor and the degenerately doped n-type semiconductor may each comprise germanium (Ge).

In different embodiments of the nanowire device, the source conductor may be a degenerately doped p-type semiconductor, wherein the monolayer of group V atoms is adjacent to and in contact with the degenerately doped p-type semiconductor, the source region comprises a group IV semiconductor source region, and the monolayer of group III atoms is adjacent to and in contact with the group IV semiconductor. In such instances, the group IV semiconductor and the degenerately doped p-type semiconductor may be the same semiconductor material or different semiconductor materials. For example, where the interfacial layer includes a monolayer of gallium (Ga) atoms and a monolayer of arsenic (As) atoms, the group IV semiconductor and the degenerately doped p-type semiconductor may each comprise germanium (Ge).

In still another embodiment of the invention, a nanowire device includes a nanowire disposed on a substrate, wherein a longitudinal length of the nanowire comprises: an undoped channel region of a first semiconductor material; an undoped semiconductor source region electrically coupled with a first end of the channel region; an undoped semiconductor drain region electrically coupled with a second end of the channel region; a gate stack comprising a gate insulator and a gate conductor coaxially wrapping completely around the channel region; a source stack electrically isolated from the gate conductor, coaxially wrapping completely around the semiconductor source region and extending along at least a portion of the semiconductor source region; and a drain stack electrically isolated from the gate conductor, coaxially wrapping completely around the semiconductor drain region and extending along at least a portion of the semiconductor drain region. The source stack includes a source conductor contacting the semiconductor source region and extending along at least a portion of the semiconductor source region, the source conductor comprising a degenerately p-type doped semiconductor and there is an offset in valence band energy between the degenerately doped p-type semiconductor and the semiconductor source region such that a valence band maximum in the degenerately doped p-type semiconductor is at a lower energy than a valence band maximum in the semiconductor source region. In such a nanowire device, the semiconductor source region may include germanium and the degenerately doped p-type semiconductor may include degenerately doped p-type silicon germanium.

BRIEF DESCRIPTION OF THE DRAWINGS

The present invention is illustrated by way of example, and not limitation, in the figures of the accompanying drawings, in which:

FIG. 7A shows an example of wrap around MIS contacts for FinFETs and FIG. 7B shows an example of wrap around MIS contacts for stacked nanowire FETS, in accordance with embodiments of the present invention.

FIGS. 9A and 9B show comparisons of current distribution for stacked nanowire FETs with an epitaxial silicon contact (FIG. 9A) and wrap around MIS contacts (FIG. 9B).

DESCRIPTION OF THE INVENTION

The present inventors recognized a desire for a metal-semiconductor contact in a transistor that is as large as possible, unconstrained by the cross-sectional area of the channel, and such a contact is provided by the present invention by decoupling the metal-semiconductor contact interface from the cross-section of the semiconductor channel. The invention provides a solution that addresses some of the many challenges to the scaling of MOS transistors into the nanoscale, namely excessive random variability in source/drain doping and increasing metal-semiconductor contact resistance, by (i) eliminating source/drain dopants, and (ii) increasing the area of the source/drain metal-semiconductor contacts.

The present invention includes a metal-semiconductor junction that provides induced charge in the semiconductor region and also a direct path for the flow of electrical current into the semiconductor region. We call the induced charge region an "induced source/drain". For an induced source/drain to be as effective as a doped source/drain, it should have a comparable concentration of free carriers, on the order of $10^{20}$ per cm$^3$. A negative Schottky barrier height between the source/drain metal and the semiconductor is required to achieve such a carrier concentration. In various embodiments there is a deliberate interfacial layer between the metal and semiconductor at the metal-semiconductor junction, the interfacial layer serving the purpose of ensuring a required negative Schottky barrier height. The interfacial layer in certain embodiments is comprised of a monolayer of atoms. The atoms may be any of N, As, P, O, S, Se, or Te for n-channel transistors or B, Ga, Al, Zn, Cd or O for p-channel transistors. The interfacial layer in certain other embodiments is a "thin insulator" comprising a material that would be an insulator in its bulk state but which is conductive when very thin (in the thickness range 0.2 nm to 2 nm). In these embodiments, the interfacial layer at the metal-semiconductor junction is not comparable or equivalent to the thin insulator that separates the gate from the semiconductor channel. Specifically, the interfacial layer is selected to be highly conductive between the metal and the induced source/drain whereas the gate insulator being selected to be non-conductive between the gate and the channel.

The present invention overcomes many limitations of conventional contacts between metals and doped semiconductor bodies by inducing free carriers (electrons or holes) in the surface of a semiconductor body through electrostatic inducement rather than by doping the semiconductor with impurity atoms. Free carriers are induced in a semiconductor source/drain, close to an interface with an adjacent contacting metal by ensuring a negative Schottky barrier between the metal and the semiconductor.

Figure 1:
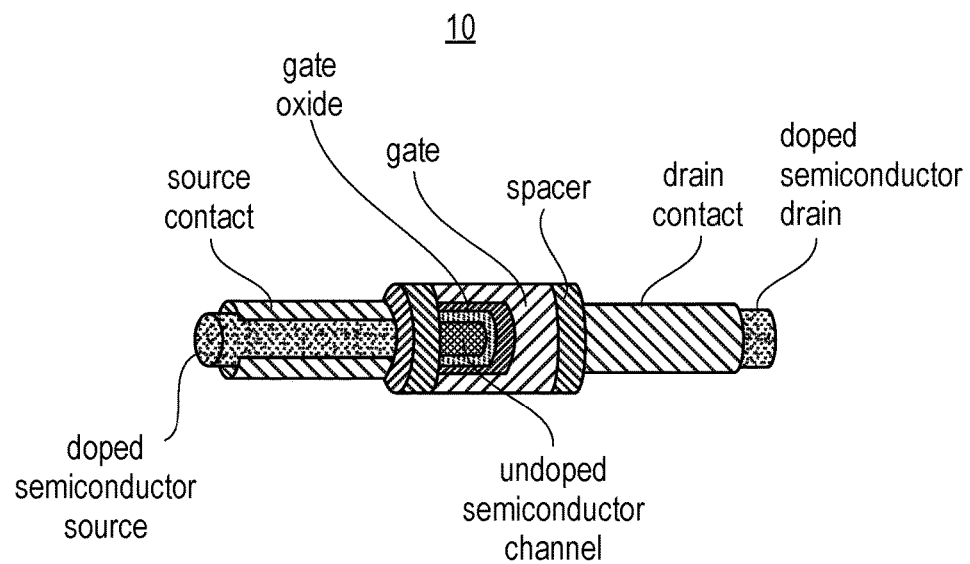
FIG. 1 shows an example of a gate-all-around nanowire transistor.
Figure 2:
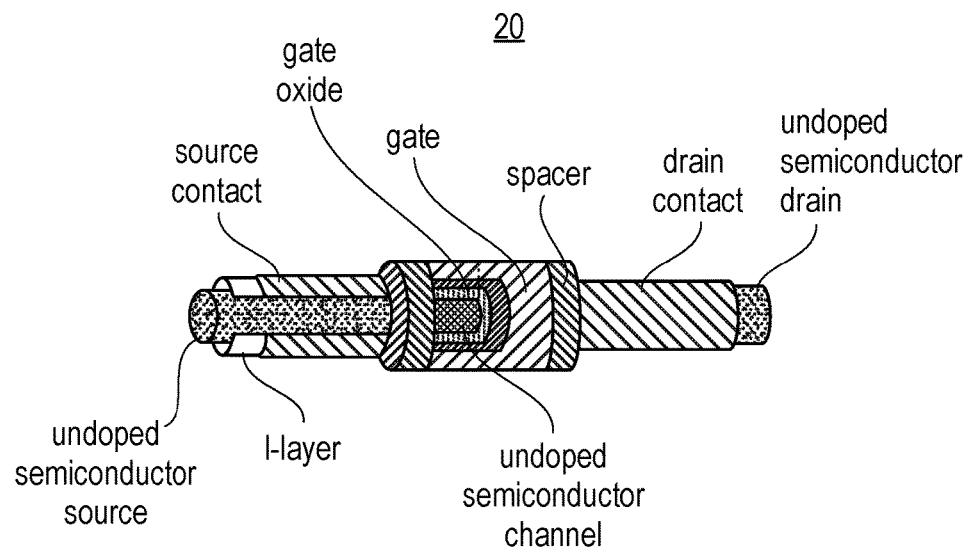
FIG. 2 shows an example of a gate-all-around nanowire transistor configured in accordance with an embodiment of the present invention.

FIG. 2 shows an example of a gate-all-around nanowire transistor 20 configured in accordance with an embodiment of the present invention. In this example, a gate wraps completely around a semiconductor channel. A gate oxide is disposed concentrically between the gate and the channel. Undoped semiconductor source and drain regions are located at opposite ends of the channel and have associated circumferential metal contacts separated from the gate by respective sidewall spacers. Between the source/drain contacts and the source/drain regions are disposed circumferential I-layers (interfacial layers) having the characteristics described herein. The existence of the I-layer ensures a negative Schottky barrier between the metal source/drain contact and the semiconductor source/drain, causing free carriers to be induced in the surface of the semiconductor body comprising the source/drain. Note that it is a characteristic of the present invention that the Schottky barrier between the metal source contact and the semiconductor source is a negative Schottky barrier, causing free carriers to be induced in the surface of the semiconductor body comprising the source, but that it is optional for the Schottky barrier between the metal drain contact and the semiconductor drain to be a negative Schottky barrier. Where the Schottky barrier between the metal drain contact and the semiconductor drain is a negative Schottky barrier, free carriers will be induced in the surface of the semiconductor body comprising the drain. This illustrated embodiment of the invention is distinguished from the conventional nanowire transistor illustrated in FIG. 1 by having no intentional doping in the nanowire transistor source/drain and by having a negative Schottky barrier between the metal source/drain contacts and the semiconductor source/drain.

It may be possible, in some embodiments to avoid the use of an I-layer if, for example, a contact metal or metals comprising the source/drain contact(s) and the semiconductor material comprising the semiconductor source/drain are paired such that the metal-semiconductor junction has a negative Schottky barrier. In other embodiments, the I-layer may be a multi-layer structure, including at least a passivation layer and a separation (or spacer) layer, where the passivation layer is adjacent the semiconductor material comprising the semiconductor source/drain.

Figure 3A:
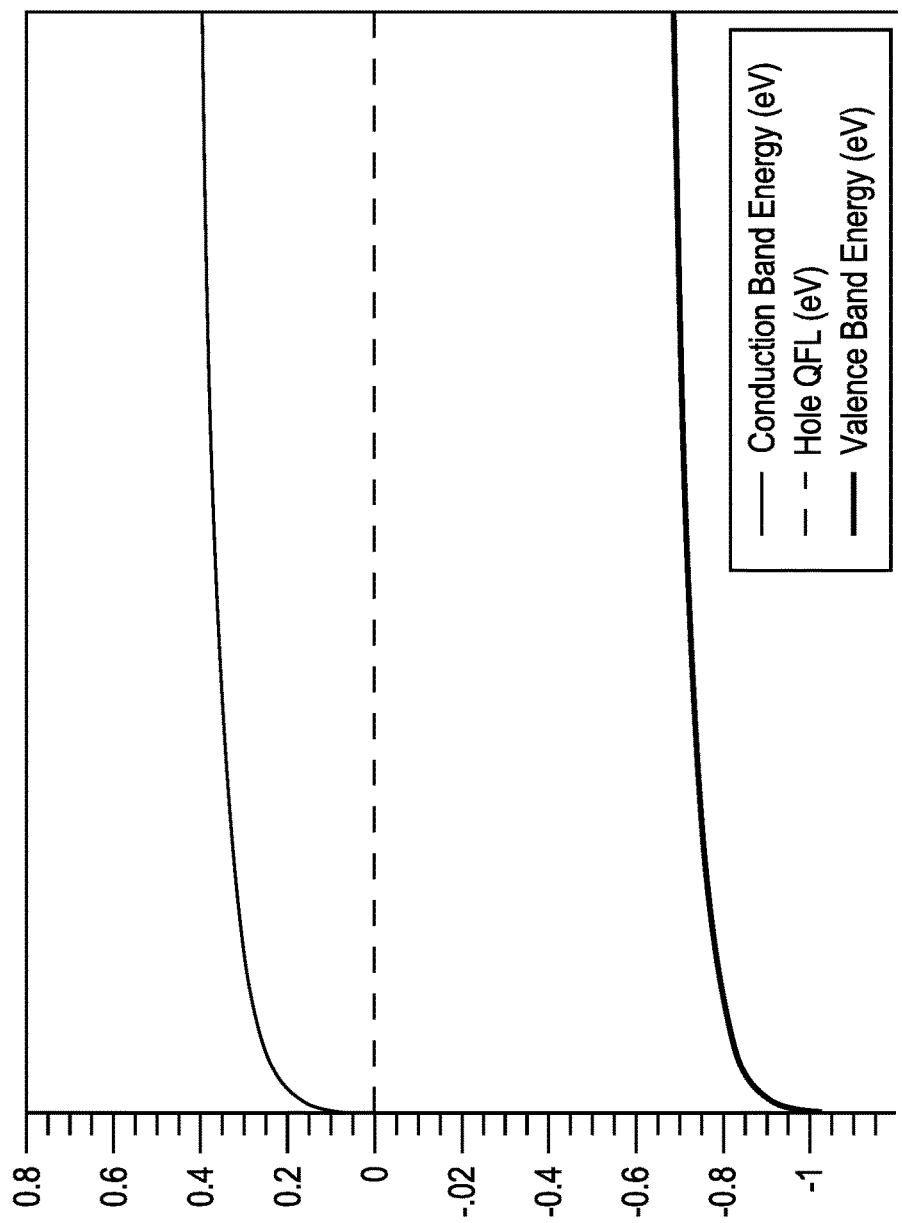
FIG. 3A is an illustration, for an "n-type" contact, of a negative Schottky barrier in which the Fermi level of a metal is at a higher energy than a conduction band edge of a semiconductor.
Figure 3B:
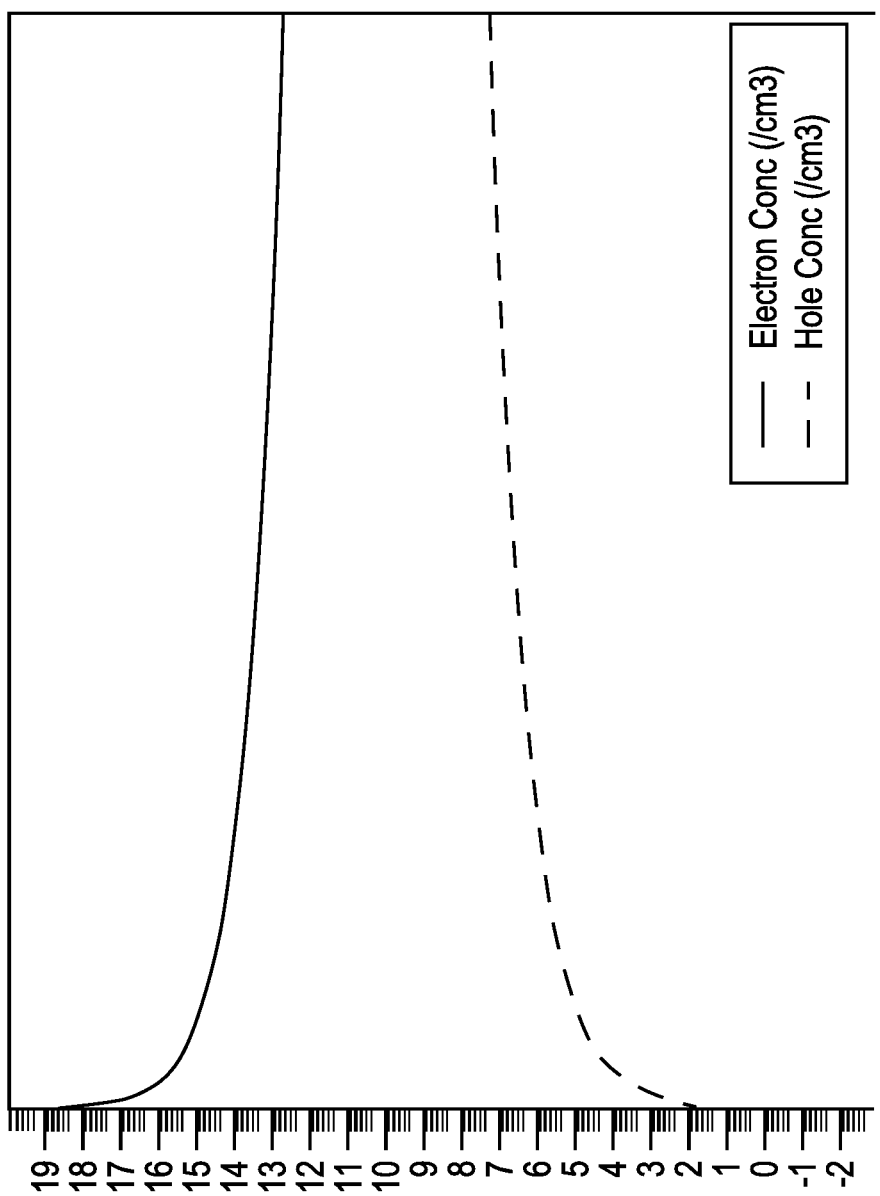
FIG. 3B illustrates the effect of electron transfer from a metal to populate the surface of a semiconductor, establishing electrostatic equilibrium between the metal and semiconductor.

In detail, for an "n-type" contact, a negative Schottky barrier means that the Fermi level of the metal is at a higher energy than the conduction band edge of the semiconductor, as illustrated in FIG. 3A, and electrons are able to conduct between the metal and the semiconductor. Under these conditions, as illustrated in FIG. 3B, some electrons transfer from the metal and populate the surface of the semiconductor to establish electrostatic equilibrium between the metal and semiconductor. As indicated above, in some embodiments of the invention an interfacial layer is present between the metal and the semiconductor, the interfacial layer permitting electrons to flow with little impedance between the metal and the semiconductor and the interfacial layer having the purpose of causing the Schottky barrier to be negative. Interfacial layers that can cause a negative Schottky barrier for electrons include tunneling dielectrics such as titanium oxide, silicon oxide, silicon nitride, and vanadium oxide. When such interfacial layers are used to cause a negative Schottky barrier for electrons, the contacting metal is preferably, but for n-FET contacts need not necessarily be, a low work function metal such as aluminum, hafnium, zirconium, titanium, lanthanum, magnesium, silver, erbium, yttrium or ytterbium. Other interfacial layers that can cause a negative Schottky barrier for electrons at metal contacts to group IV semiconductors such as silicon and germanium include dipole-inducing monolayers of group V elements such as arsenic, phosphorus or nitrogen or dipole-inducing monolayers of group VI elements such as or sulfur, selenium, tellurium or oxygen or bilayers of group V and group III elements where the group V atoms are on the semiconductor side of the contact and group III atoms on the metal side. Some embodiments of n-type contacts with negative Schottky barriers have a low work function contact metal such as aluminum, hafnium, zirconium, titanium, lanthanum, magnesium, silver, erbium, yttrium or ytterbium, with an interfacial layer between the low work function metal and the semiconductor. Other embodiments of n-type contacts with negative Schottky barriers have a low work function contact metal that is a metal oxide such as zinc oxide (ZnO), with an interfacial layer between the low work function metal oxide and the semiconductor.

Figure 4A:
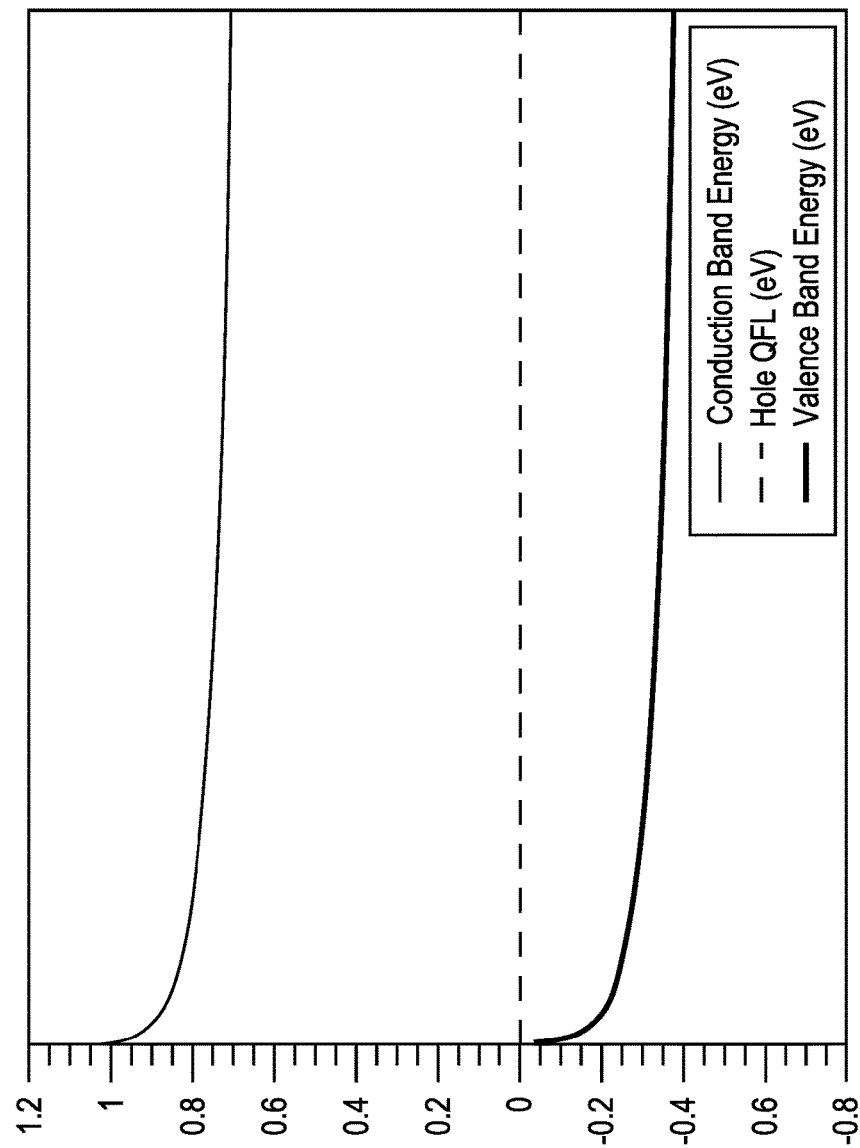
FIG. 4A is an illustration, for a "p-type" contact, of a negative Schottky barrier in which the Fermi level of a metal is at a lower energy than a valence band edge of a semiconductor.
Figure 4B:
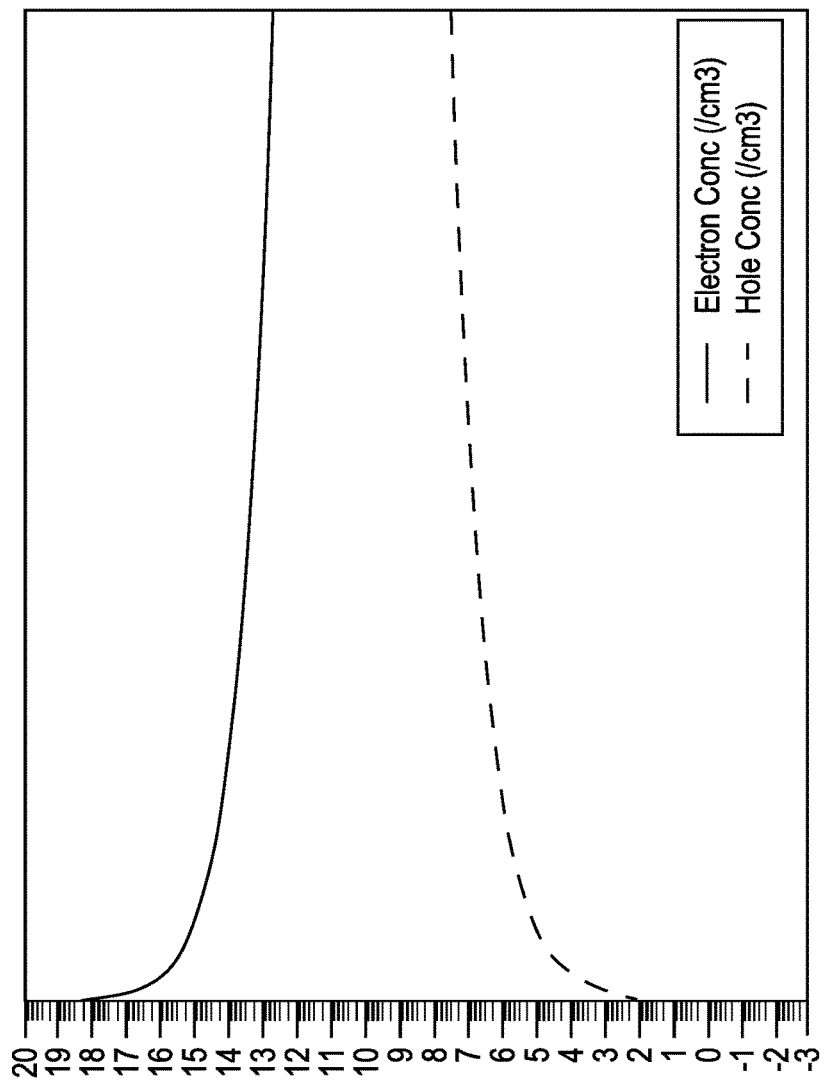
FIG. 4B illustrates the effect of valence electron transfer from the surface of a semiconductor to a metal, where the surface of the semiconductor is populated with holes to an extent necessary to establish electrostatic equilibrium between the metal and semiconductor.

For a "p-type" contact, a negative Schottky barrier means that the Fermi level of the metal is at a lower energy than the valence band edge of the semiconductor as depicted in FIG. 4A. This may be considered a negative Schottky barrier for holes. Under these conditions, some valence electrons transfer from the surface of the semiconductor to the metal and the surface of the semiconductor is populated with holes to an extent necessary to establish electrostatic equilibrium between the metal and semiconductor, as indicated in FIG. 4B. It is possible for an interfacial layer to be present between the metal and the semiconductor, the interfacial layer permitting holes (or in alternative interpretation electrons moving in the opposite direction), to flow with little impedance between the metal and the semiconductor. For "p-type contacts", the interfacial layer has the purpose of causing the Schottky barrier for holes to be negative. Interfacial layers that can cause a negative Schottky barrier for holes include tunneling dielectrics such as zinc oxide. When such interfacial layers are used to cause a negative Schottky barrier for holes, the contacting metal is preferably, but for p-FET contacts need not necessarily be, a high work function contact metal such as nickel, cobalt, iridium, rhodium, ruthenium, gold, osmium, palladium or platinum, or a high work function conductive metal oxide such as $MoO_x$, $WO_x$, $CrO_x$ (each with composition factor x approximately equal to 3) or $V_2O_5$. In some embodiments, pFET and nFET contacts may comprise the same metal, but have different interfacial layers to provide the desired negative Schottky barriers in each case.

Other interfacial layers that can cause a negative Schottky barrier for holes on group IV semiconductors include dipole-inducing monolayers of group III elements such as boron, gallium or aluminum or bilayers of group V and group III elements where the group V atoms are on the metal side of the contact and group III atoms on the semiconductor side. Some preferred embodiments of p-type contacts have a high work function contact metal such as nickel, cobalt, iridium, rhodium, ruthenium, gold, osmium, palladium or platinum, or a high work function conductive metal oxide such as $MoO_x$, $WO_x$, $CrO_x$ (with x approximately equal to 3) or high work-function $V_2O_x$ (with x approximately equal to 5) with an interfacial layer between the high work function metal (or metal oxide) and the semiconductor.

The invention also has great utility where a low resistance metal-contacted source or drain is required in a semiconductor material that might not be doped conveniently or for which doping might not be possible at all. Examples of such semiconductors may be two-dimensional semiconductors such as graphene, germanene, phosphorene, stannene and silicene or two-dimensional layered transition metal dichalcogenide (TMDC) semiconductors such as MoS and WSe which have recently been recognized as strong candidates as future transistor channel materials. Other materials that may not be amenable to conventional doping include organic semiconductors, polymer semiconductors, fullerenes such as carbon nanotubes, amorphous semiconductors, perovskites. All semiconductors in the form of a nanoscale thin film or nanowire benefit from this invention by virtue of the fact that free carriers are induced in the semiconductor material by an adjacent metal so long as there is a negative Schottky barrier between the metal and the semiconductor.

If the semiconductor is a thin film or two-dimensional semiconductor, typically having a thickness of 12 nm or less, with two primary faces, it is preferred to have metal contacts on both faces with both metal contacts having a negative Schottky barrier to the semiconductor. Note, however, that it is a characteristic of the present invention that the Schottky barrier between the metal source contact and the semiconductor source is a negative Schottky barrier, but that it is optional for the Schottky barrier between the metal drain contact and the semiconductor drain to be a negative Schottky barrier.

If the semiconductor is a "one-dimensional" semiconductor, either cylindrical, such as a carbon nanotube, or a semiconductor "nanowire" where the wire may have circular, square or any other cross-sectional shape with a wire width of approximately 20 nm or less, it is preferred to have the metal contact wrap around the outer surface of the nanowire, again with the metal contact having a negative Schottky barrier to the semiconductor.

In a transistor with a fully depleted channel (may be a FinFET, FDSOI FET or nanowire FET), a thin body of semiconductor includes a channel region and source and drain regions where the source/drain regions are undoped and the source/drain metal contacts surround the semiconductor on two sides (FDSOI-FET or FinFET) or completely (nanowire FET).

In other embodiments, the free carriers induced by the contact metal with negative Schottky barrier may be additional to free carriers introduced into the semiconductor by doping. As such it is not essential that the semiconductor be undoped for the invention to provide an advantage in a semiconductor device. For example, the source and drain regions of a nanowire or FinFET transistor maybe doped conventionally (e.g., by diffusion of atoms from an external solid source or ion implantation and thermal activation) and the randomness of the dopants tolerated, the induced carriers provided by this invention being additional to the carriers provided by doping and therefore reducing the variability while not eliminating it.

In one embodiment, a nanowire transistor comprises a nanowire disposed on a substrate. The nanowire further comprises, along a longitudinal length, an undoped channel region of a first semiconductor material, an undoped semiconductor source region electrically coupled with a first end of the channel region and an undoped semiconductor drain region electrically coupled with a second end of the channel region. A gate stack comprising a gate insulator and a gate conductor is wrapped coaxially completely around the channel region and controls electrical conduction through the semiconductor (channel) between the source and drain regions.

A source contact stack comprises an interfacial layer and a source conductor coaxially wrapping completely around the semiconductor source region and extending along at least a portion of the semiconductor source region. A drain stack comprises an interfacial layer and a drain conductor coaxially wrapping completely around the semiconductor drain region and extending along at least a portion of the semiconductor drain region. The Schottky barrier between the source conductor and the semiconductor source region is a negative Schottky barrier and a concentration of free carriers is induced in the semiconductor source region. The Schottky barrier between the drain conductor and the semiconductor drain region may, but need not necessarily, be a negative Schottky barrier, but if it is, a concentration of free carriers is induced in the semiconductor drain region. The thickness of the nanowire in the nanowire transistor is 20 nm or less. The first undoped semiconductor in the channel region and the source region may be comprised of the same semiconductor material. Alternatively, the source region may be comprised of a semiconductor material that is different from the first semiconductor material in the channel region.

Figure 5:
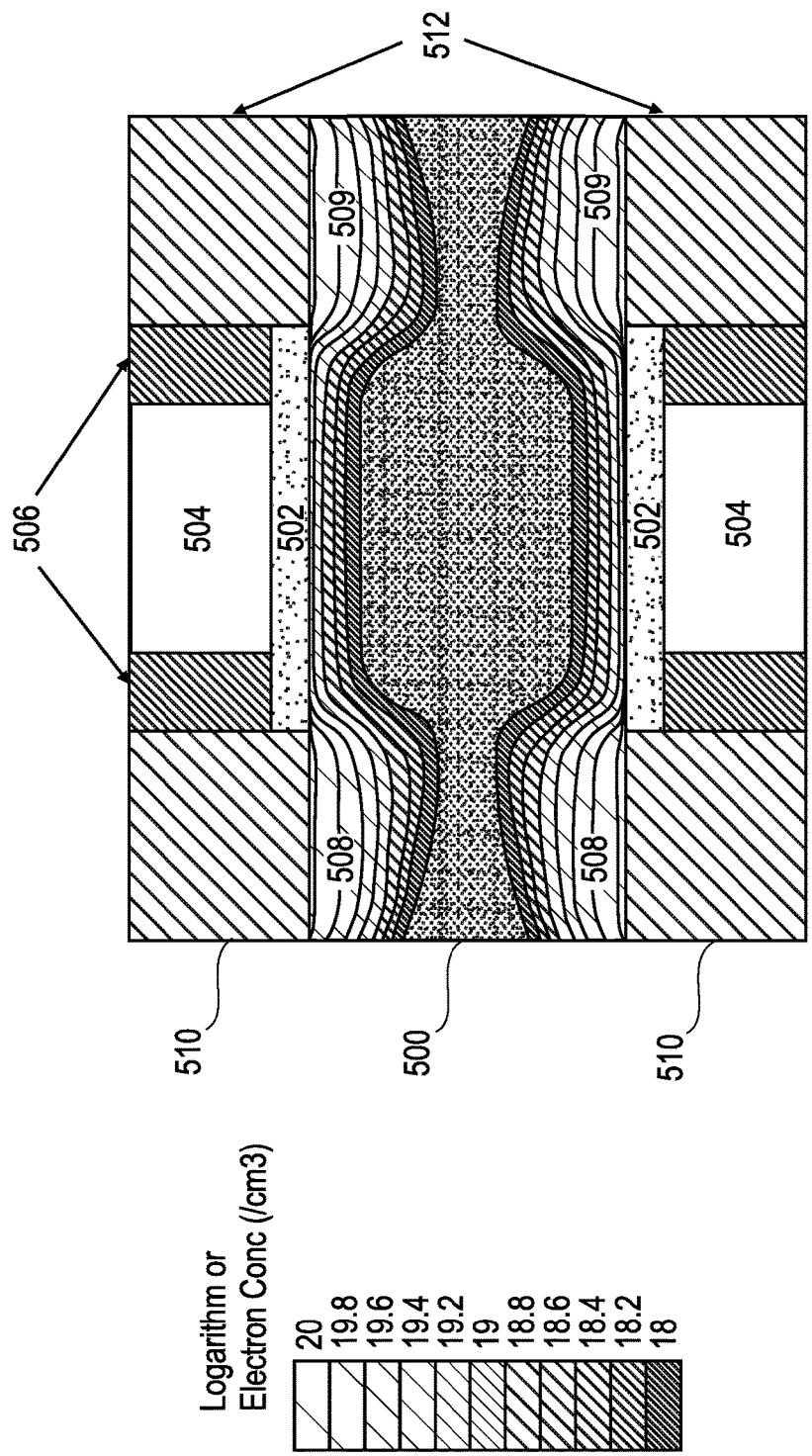
FIG. 5 illustrates electron concentrations for a cross section along a fin of a finFET transistor.
Figure 6A:
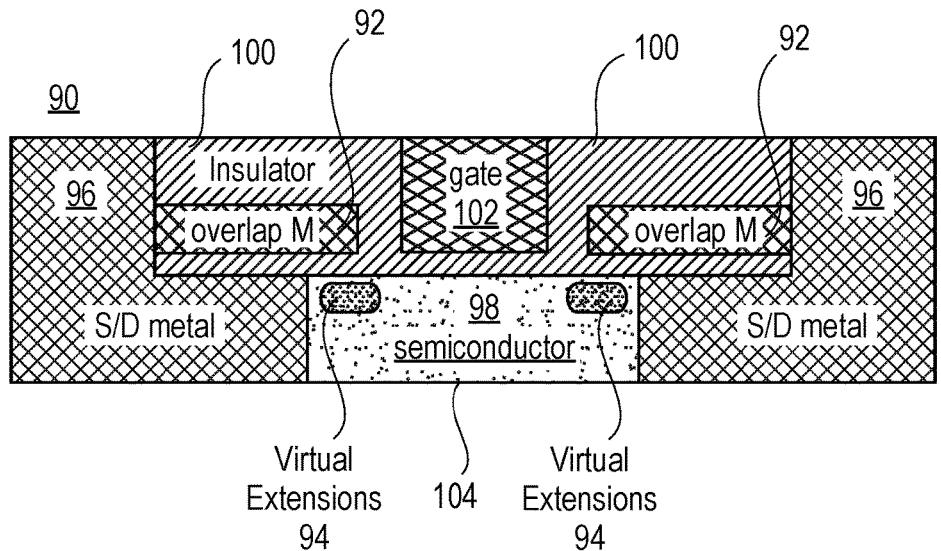
FIGS. 6A and 6B are reproduced from FIGS. 6a and 6c, respectively, of U.S. Pat. No. 6,891,234, assigned to the assignee of the present invention, and illustrate induced charge regions in various transistor configurations.
Figure 6B:
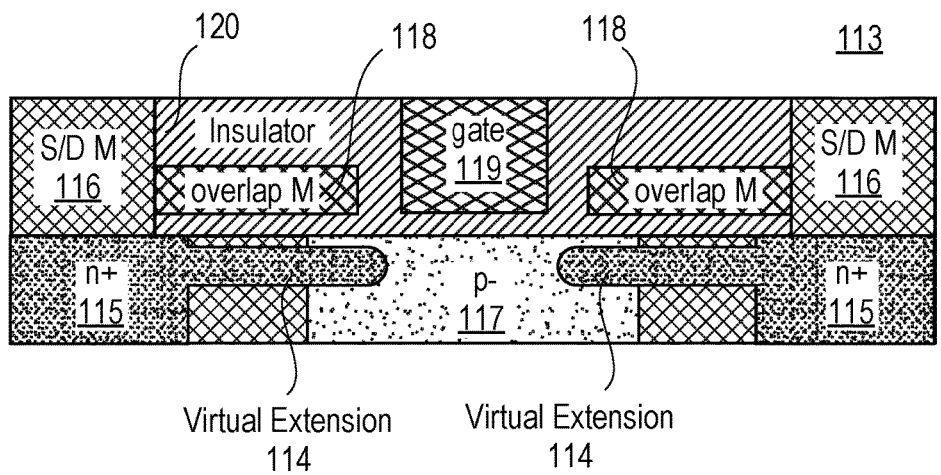

In another embodiment, a finFET transistor comprises a semiconductor fin disposed on a substrate, wherein the fin has two major faces. FIG. 5 represents a cross section along the fin 500. A longitudinal length of the fin comprises an undoped channel region of a first semiconductor material, an undoped semiconductor source region electrically coupled with a first end of the channel region and an undoped semiconductor drain region electrically coupled with a second end of the channel region. A gate stack comprising a gate insulator 502 and a gate conductor 504 wraps around at least two sides of the channel region and provides electrical control of the current flow between the source and the drain.

The source region is electrically contacted through a source contact stack comprising an interfacial layer and a source conductor 510 wrapping around at least two sides of the semiconductor source region and extending along at least a portion of the semiconductor source region. The drain region is electrically contacted through a drain contact stack comprising an interfacial layer and a drain conductor 512 wrapping around at least two sides of the semiconductor drain region and extending along at least a portion of the semiconductor drain region. The Schottky barrier between the source conductor and the semiconductor source region is a negative Schottky barrier causing a concentration of free carriers to be induced in the semiconductor source region 508. The Schottky barrier between the drain conductor and the semiconductor drain region may, but need not necessarily, be a negative Schottky barrier, but if it is, a concentration of free carriers is induced in the semiconductor drain region 509.

The source conductor 510 and the drain conductor 512 are electrically isolated from the gate 504 by insulating gate sidewall spacers 506. The thickness of the fin of the FinFET transistor as measured between the two vertical faces is 12 nm or less The first undoped semiconductor in the channel region and the source region may be comprised of the same semiconductor material. Alternatively, the source region may be comprised of a semiconductor material that is different from the first semiconductor material in the channel region. The first undoped semiconductor in the channel region and the drain region may be comprised of the same semiconductor material. Alternatively, the drain region may be comprised of a semiconductor material that is different from the first semiconductor material in the channel region.

In other embodiments a source region is electrically contacted through a source contact stack comprising an interfacial layer and a source conductor wrapping around at least two sides of the semiconductor source region and extending along at least a portion of the semiconductor source region and having a negative Schottky barrier for electrons and a drain region is electrically contacted through a drain contact stack comprising an interfacial layer and a drain conductor wrapping around at least two sides of the semiconductor drain region and extending along at least a portion of the semiconductor drain region and, optionally, having a negative Schottky barrier for holes such that the carriers induced in the source region are of opposite type to the carriers induced in the drain region. Such a configuration of "n-type" source and "p-type" drain may be useful for example for providing a gated diode electrical function.

In other embodiments, a source region is electrically contacted through a source contact stack comprising an interfacial layer and a source conductor wrapping around at least two sides of the semiconductor source region and extending along at least a portion of the semiconductor source region and having a negative Schottky barrier for holes and a drain region is electrically contacted through a drain contact stack comprising an interfacial layer and a drain conductor wrapping around at least two sides of the semiconductor drain region and extending along at least a portion of the semiconductor drain region and, optionally, having a negative Schottky barrier for electrons with the result that the carriers induced in the source region are of opposite polarity to the carriers induced in the drain region. Such a configuration of "p-type" source and "n-type" drain may be useful for example for providing a gated diode electrical function.

In still further embodiments, a source contact stack comprises a source conductor contacting a semiconductor source region and extending along at least a portion of the semiconductor source region wherein the source conductor is a degenerately n-type doped semiconductor and there is an offset in conduction band energy between the degenerately doped semiconductor and the semiconductor source region such that the conduction band minimum in the degenerately doped n-type semiconductor is at a higher energy than the conduction band minimum in the semiconductor source region. As a consequence of the conduction band offset, electrons from the degenerately doped n-type semiconductor populate the semiconductor source region.

Still another embodiment of the invention provides an interfacial layer that causes the offset in the conduction band energies referred to above. A preferred interfacial layer that causes the desired offset in the conduction band energies comprises at least one epitaxial bilayer of group III and group V atomic monolayers, such interfacial layer causing an electronic dipole that induces the conduction band offset (as detailed in the present applicant's U.S. Pat. No. 9,362,376, incorporated herein by reference).

One example of a source contact stack in which a source conductor is a degenerately n-type doped semiconductor is a source contact stack in which the source material is silicon and the degenerately doped n-type semiconductor that contacts the source is degenerately doped n-type gallium phosphide (GaP). The desired conduction band offset arises naturally between GaP and silicon with the conduction band edge in the GaP being at a higher energy than the conduction band edge in the silicon. The use of a source contact stack in which a source conductor is a degenerately n-type doped semiconductor in accordance with embodiments of the present invention is not limited to n-type GaP contacting silicon but should be understood to include a coupling of any two semiconductors that have a naturally occurring conduction band offset at their heterointerface. These include, in addition to GaP, the following: Ge; AlAs; AlSb, ZnS; ZnSe and ZnTe.

Alternatively, in another embodiment, an interfacial layer between a group IV semiconductor source region and a degenerately n-type doped semiconductor contact region causes an additional offset in the conduction band energies. A preferred interfacial layer that causes the desired offset in the conduction band energies comprises at least one epitaxial bilayer of group III and group V atomic monolayers, with the monolayer of group V atoms being adjacent to and in contact with the group IV semiconductor source region and the monolayer of group III atoms being adjacent to and in contact with the degenerately n-type doped semiconductor contact region. In this embodiment, the group IV semiconductor source region and the degenerately doped semiconductor contact region may be formed of different semiconductor materials or of the same semiconductor material. In one example, a junction between two regions of germanium (Ge) are separated by an interface layer comprising a monolayer of gallium (Ga) and a monolayer of arsenic (As) atoms, the Ge conduction band edge on the As side of the junction is at a lower energy (of the order of 0.35-0.45 eV) than the Ge conduction band edge on the Ga side of the junction. Such an interfacial layer causes an electronic dipole that induces the valence band offset is described in U.S. Pat. No. 9,362,376 and in a 1991 article by McKinley et al. entitled "Control of Ge homojunction band offsets via ultrathin Ga—As dipole layers," J. Vac. Sci. Technol. A 9 (3), May/June 1991, and in a similar article by McKinley et al. in 1992, entitled "Control of Ge homojunction band offsets via ultrathin Ga—As dipole layers," Applied Surface Science Vol. 56-58, pp. 762-765 (1992).

Equivalent embodiments for instances in which holes are the charge carries are also embodiments of the present invention. For example, a source contact stack may comprise a source conductor contacting a semiconductor source region and extending along at least a portion of the semiconductor source region, wherein the source conductor is a degenerately p-type doped semiconductor and there is an offset in valence band energy between the degenerately doped p-type semiconductor and the semiconductor source region such that the valence band maximum in the degenerately doped semiconductor is at a lower energy than the valence band maximum in the semiconductor source region. As a consequence of the conduction band offset, holes from the degenerately doped p-type semiconductor populate the semiconductor source region.

One example is a source contact stack in which the source material is germanium and the degenerately doped p-type semiconductor that contacts the source is degenerately doped p-type silicon germanium (SiGe) alloy. The desired valence band offset arises naturally between germanium and SiGe with the valence band edge in the SiGe being at a lower energy than the valence band edge in the germanium. Embodiments of the invention are not limited to p-type SiGe contacting germanium but should be understood to include a coupling of any two semiconductors that have a naturally occurring valence band offset at their heterointerface.

Alternatively, in another embodiment, an interfacial layer between a group IV semiconductor source region and a degenerately doped semiconductor contact region causes an additional offset in the valence band energies. A preferred interfacial layer that causes the desired offset in the valence band energies comprises at least one epitaxial bilayer of group III and group V atomic monolayers, with the monolayer of group III atoms being adjacent to and in contact with the group IV semiconductor source region and the monolayer of group V atoms being adjacent to and in contact with the degenerately p-type doped semiconductor contact region. In this embodiment, the group IV semiconductor source region and the degenerately doped semiconductor contact region may be formed of different semiconductor materials of the same semiconductor material. In an exemplary junction between two regions of germanium (Ge) separated by an interface layer comprising a monolayer of gallium (Ga) and a monolayer of arsenic (As) atoms, the Ge valence band edge on the As side of the junction is at a lower energy (of the order of 0.35-0.45 eV) than the Ge valence band edge on the Ga side of the junction. Such an interfacial layer causes an electronic dipole that induces the valence band offset is described in U.S. Pat. No. 9,362,376, and in the McKinley articles cited above.

In the above description, the nanowire has been described (at least in the accompanying illustrations) as having a circular or approximately circular cross-section. However, the invention is not limited to such geometries and nanowires of the present invention may have other shapes, such as square, rectangular, oval, or other cross-sections. Such geometries may be recognized as "nanosheets" and as used herein the term nanowire should be read as including nanosheets. Stated differently, the cross-sectional shape of the nanowire is not critical to the present invention.

Similarly, the foregoing description refers to a gate stack wrapping completely around a channel region; a source stack coaxially wrapping completely around a semiconductor source region; and a drain stack coaxially wrapping completely around a semiconductor drain region. Such a geometry is true for a three-dimensional nanowire—that is, a nanowire having a three-dimensional cross-section. However, the present invention is also applicable to nanowires comprised of two-dimensional semiconductors, such as graphene, hexagonal boron nitride, or transition metal dichalcogenides (e.g., $MoS_2$, $MoSe_2$, $MoTe_2$, $WS_2$, $WSe_2$, $WTe_2$, etc.). In such instances, "wrapping completely around" should be understood as including instances where contact is made to both (opposing) sides of the two-dimensional semiconductor. In some cases, contacts may be made to only a single face of a two-dimensional semiconductor, but such instances would not be considered as a stack "wrapping completely around" a region.

In various embodiments, the present invention further provides wraparound MIS contacts to FinFETs and/or stacked nanowire FETs. One benefit provided by the present wrap around MIS contacts over silicide contacts is that it avoids the need to deposit sacrificial silicon (or other semiconductor material), e.g., in the case of forming contacts for FinFETs, for silicide contacts. In the case of nanowires, the use of wraparound MIS contacts allows for the use of a surrounding metal contact rather than an epitaxial silicon contact, which improves current load balancing across a stack of nanowires.

FIG. 7A shows an example of wrap around MIS contacts for FinFETs and FIG. 7B shows an example of wrap around MIS contacts for stacked nanowire FETS, in accordance with embodiments of the present invention. In the example shown in FIG. 7A, semiconductor fins 710 are wrapped by interface layers ("I-layer") 712, which in turn are wrapped by contact metal layers 714. The interface layers and the contact metal layers may be deposited using atomic layer deposition (ALD) techniques. In FIG. 7b, semiconductor nanowires 716a-716c are stacked in a vertical arrangement. Each nanowire is wrapped by an interface layer 718, which, in turn, is wrapped by a contact metal layer 720. The interface layers and the contact metal layers may be deposited using atomic layer deposition (ALD) techniques. In some embodiments, conductive metal oxide wrap around MIS contacts for FinFETs and stacked nanowire FETS may be employed. Many conductive metal oxides are available. Lower workfunction metals may be preferred for NMOS applications (e.g., ZnO), and higher workfunction metals may be preferred for PMOS applications (e.g., $MoO_2$). Interface layers in such embodiments may also include metal oxides, where lower electron barrier metals may be preferred for NMOS applications (e.g., $TiO_2$), and lower hole barrier metals may be preferred for PMOS applications. Lower temperature metal oxide depositions are preferred (e.g., plasma assisted ALD, thermal ALD with ozone).

Figure 8A:
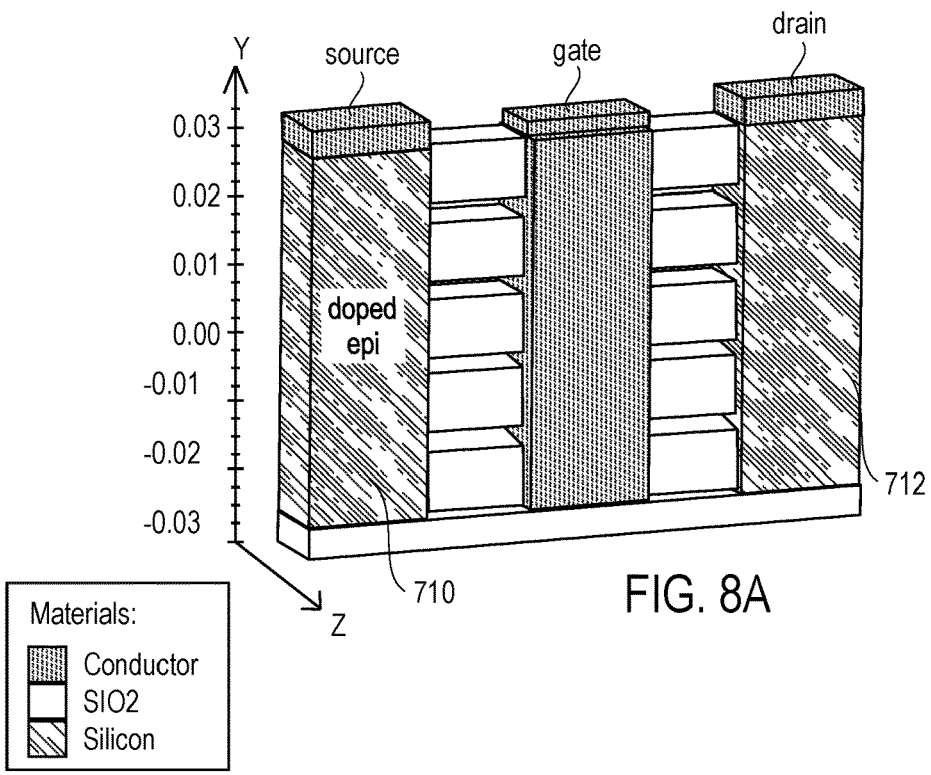
FIG. 8A shows an example of an epitaxial silicon contact to source/drain regions of nanowire FETs.
Figure 8B:
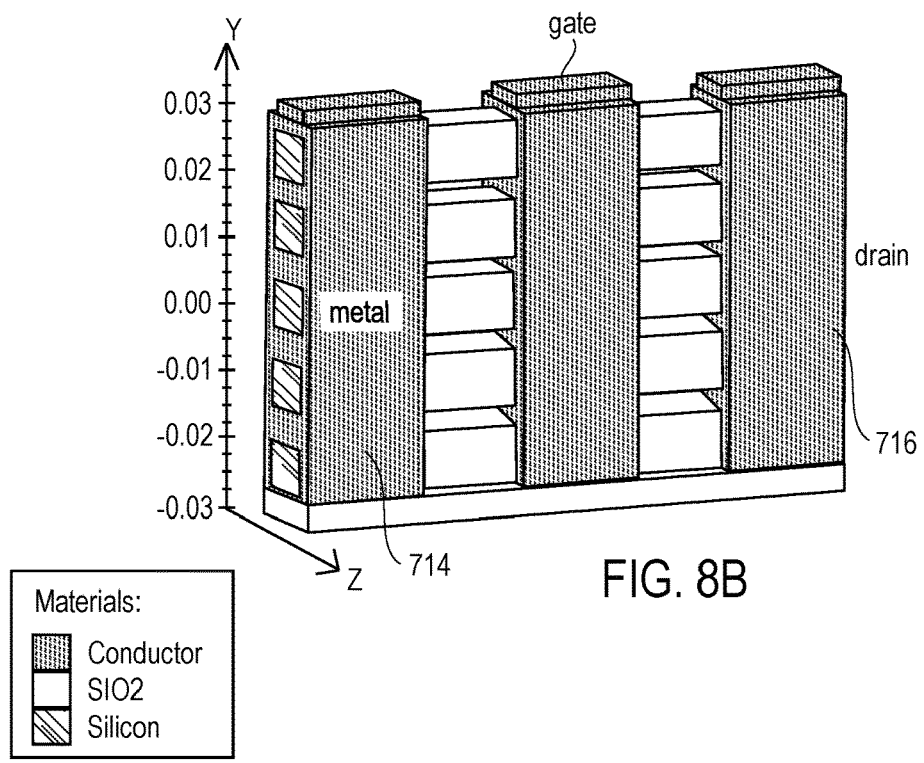
FIG. 8B shows an example of wrap around MIS contacts for stacked nanowire FETs in accordance with an embodiment of the present invention.

FIG. 8B shows an example of wrap around MIS contacts for stacked nanowire FETs in accordance with an embodiment of the present invention as compared to an epitaxial silicon contact shown in FIG. 8A. In FIG. 8A single doped epitaxial silicon contacts 710, 712 are made to source/drain regions of stacked nanowires. In FIG. 8B, wrap around MIS contacts 714, 716 are made to source/drain regions of stacked nanowires.

FIGS. 9A and 9B shows comparisons of current distribution for stacked nanowire FETs having an epitaxial silicon contact (FIG. 9A) and wrap around MIS contacts in accordance with an embodiment of the present invention (FIG. 9B). Each illustration shows a stack of nanowire FETs in cross section, where the nanowires are shaded to represent respective current densities therein according to simulation results. In FIG. 9A, stacked nanowire FETs 910a-910e are contacted by an epitaxial silicon contact 912. In FIG. 9B, stacked nanowire FETs 914a-914e are contacted by an MIS contact 916. Not shown are the electrical contacts to the stacks, but they are assumed to be at the top of the stacks as oriented on the page. As illustrated, simulation showed that improved current distribution over the nanowires having MIS contacts provides lower variability than in a stack with an epitaxial silicon contact, as current is better averaged over all of the nanowires in the stack. This may also improve reliability as it may reduce individual wire heating due to current flow.

Figure 10:
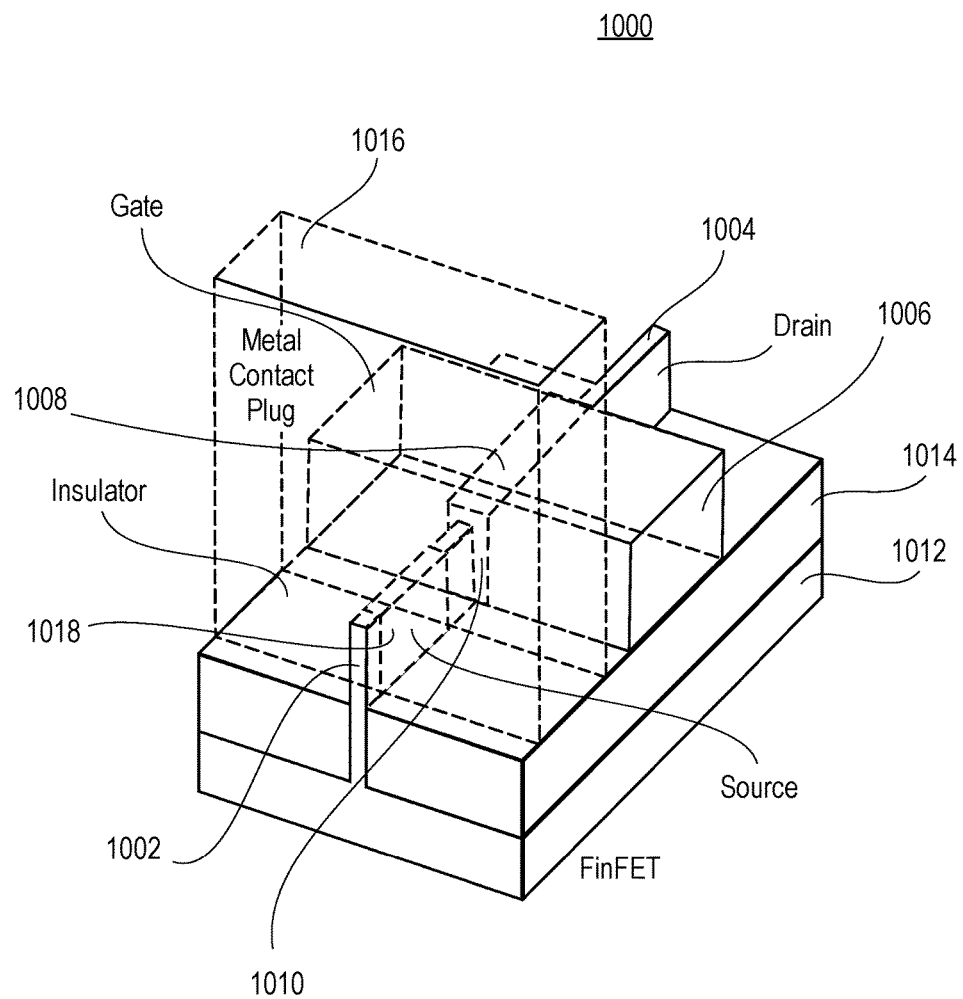
FIG. 10 shows an example of a wrap around MIS contact for a FinFET in accordance with an embodiment of the present invention.

FIG. 10 shows an example of a wrap around MIS contact for a FinFET in accordance with an embodiment of the present invention. FinFET 1000 includes source 1002, drain 1004, and gate 1006. Disposed between the source and drain is a channel region 1008. A gate dielectric 1010 is disposed between the gate and the channel. The source, drain, and channel region form a "fin" of a semiconductor substrate 1012, on which is disposed an oxide layer 1014. The MIS contact in this example is shown for the source 1002 and includes a metal contact plug 1016 surrounding an interface layer 1018. In this example, the MIS contact would be considered "wrapped completely around" the source inasmuch as it contacts at least two sides of the fin.

Thus, semiconductor devices having a region of undoped semiconductor material that is made effectively n-type or p-type by inducing a quantity of electrons or holes (respectively) on the semiconductor side of a metal-semiconductor junction by virtue of a negative Schottky barrier between the metal and the semiconductor have been described.

What is claimed is:

1. A nanowire transistor, comprising:
   a gate circumferentially surrounding and displaced from a semiconductor nanowire channel by an electrically insulating gate oxide, the semiconductor nanowire channel having no intentional doping;
   a source at a first end of the nanowire channel, and a drain at a second end of the nanowire channel, the source and drain each comprising undoped semiconductor material; and
   a first metal contact circumferentially surrounding the source and providing an electrically conductive path to the source, and a second metal contact circumferentially surrounding the drain and providing an electrically conductive path to the drain,
   wherein the first metal contact electrostatically induces free charge carriers in the source, the first metal contact is separated from the gate by an insulating material layer or a gap, and the second metal contact is separated from the gate by an insulating material layer or a gap.

2. The nanowire transistor of claim 1, wherein
   the first metal contact circumferentially surrounding the source comprises a source stack comprising an interfacial layer and a source conductor;
   the second metal contact circumferentially surrounding the drain comprises a drain stack comprising an interfacial layer and a drain conductor; and
   a Schottky barrier between the first metal contact which electrostatically induces free charge carriers in the source and the semiconductor source region is a negative Schottky barrier.

3. The nanowire transistor of claim 2, wherein a Schottky barrier between the second metal contact which electrostatically induces free charge carriers in the drain and the drain is a negative Schottky barrier.

4. The nanowire transistor of claim 2, wherein the nanowire is 20 nm or less thick.

5. The nanowire transistor of claim 2, wherein the free charge carriers are electrons.

6. The nanowire transistor of claim 2, wherein the free charge carriers are holes.

7. The nanowire transistor of claim 2, wherein the Schottky barrier between the first metal contact and the source is between −0.1 eV and −0.5 eV.

8. The nanowire transistor of claim 2, wherein the interfacial layer of the source stack and interfacial layer of the drain stack each comprise a material that would be an insulator or a semiconductor in its bulk state.

9. The nanowire transistor of claim 2, wherein the semiconductor nanowire channel, the source, and the drain are all comprised of the same semiconductor material.

10. The nanowire transistor of claim 2, wherein the semiconductor nanowire channel and the source, and the drain are not all comprised of the same semiconductor material.

11. The nanowire transistor of claim 2, wherein the source comprises silicon, germanium, silicon carbide, or an alloy comprising two or more of silicon, germanium, carbon and tin.

12. The nanowire transistor of claim 11, wherein the free charge carriers are electrons.

13. The nanowire transistor of claim 12, wherein the interfacial layer of the source stack comprises a monolayer of elements from group V or group VI.

14. The nanowire transistor of claim 11, wherein the free charge carriers are holes.

15. The nanowire transistor of claim 14, wherein the interfacial layer of the source stack comprises a monolayer of elements from group III or group II.

16. The nanowire transistor of claim 1, wherein the second metal contact electrostatically induces free charge carriers in the drain.

17. The nanowire transistor of claim 1, wherein the free charge carriers are electrons.

18. The nanowire transistor of claim 1, wherein the free charge carriers are holes.

19. The nanowire transistor of claim 1, wherein a Schottky barrier between the first metal contact and the source has a negative Schottky barrier height.

20. The nanowire transistor of claim 1, wherein a Schottky barrier between the first metal contact and the source is between −0.1 eV and −0.5 eV.

21. The nanowire transistor of claim 1, wherein the first metal contact is displaced from the source by a first interface layer, and the second metal contact is displaced from the drain by a second interface layer, the first and second interface layers each comprising a material that would be an insulator or a semiconductor in its bulk state.

22. The nanowire transistor of claim 1, wherein a first interface layer at an interface between the first metal contact and the source and a second interface layer at an interface between the second metal contact and the drain each comprise a monolayer of elements from group V or group VI and the induced free charge carriers are electrons.

23. The nanowire transistor of claim 1, wherein a first interface layer at an interface between the first metal contact and the source and a second interface layer at an interface between the second metal contact and the drain each comprise a monolayer of elements from group III and the induced free charge carriers are holes.

24. The nanowire transistor of claim 1, wherein the semiconductor nanowire channel, the source, and the drain are all comprised of the same semiconductor material.

25. The nanowire transistor of claim 24, wherein the semiconductor material is silicon, germanium, silicon carbide, a compound semiconductor, a fullerene, or an alloy comprising two or more of silicon, germanium, carbon and tin.

26. The nanowire transistor of claim 1, wherein the semiconductor nanowire channel, the source, and the drain are not all comprised of the same semiconductor material.

* * * * *